(12) United States Patent
Fujimoto et al.

(10) Patent No.: US 7,190,239 B2
(45) Date of Patent: Mar. 13, 2007

(54) VARIABLE INDUCTOR, OSCILLATOR INCLUDING THE VARIABLE INDUCTOR AND RADIO TERMINAL COMPRISING THIS OSCILLATOR, AND AMPLIFIER INCLUDING THE VARIABLE INDUCTOR AND RADIO TERMINAL COMPRISING THIS AMPLIFIER

(75) Inventors: Ryuichi Fujimoto, Tokyo (JP); Tetsuro Itakura, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/204,166

(22) Filed: Aug. 16, 2005

(65) Prior Publication Data

US 2006/0033584 A1    Feb. 16, 2006

Related U.S. Application Data

(62) Division of application No. 10/448,367, filed on May 30, 2003, now Pat. No. 7,098,737.

(30) Foreign Application Priority Data

| May 31, 2002 | (JP) | ............... 2002-160621 |
| Jun. 28, 2002 | (JP) | ............... 2002-188946 |
| Sep. 18, 2002 | (JP) | ............... 2002-270984 |

(51) Int. Cl.
*H03B 1/00* (2006.01)
(52) U.S. Cl. .................. 331/181; 331/177 V
(58) Field of Classification Search ............. 330/54, 330/52; 331/181, 177 V
See application file for complete search history.

(56) References Cited

U.S. PATENT DOCUMENTS

| 2,334,704 | A | 11/1943 | Hilferty |
| 4,580,114 | A | 4/1986 | Upadhyayula |
| 5,912,596 | A | 6/1999 | Ghoshal |
| 5,994,985 | A | 11/1999 | Pehlke et al. |
| 6,121,850 | A * | 9/2000 | Ghoshal ............. 331/181 |
| 6,392,490 | B1 | 5/2002 | Gramegna et al. |
| 6,642,787 | B1 | 11/2003 | Souetinov et al. |
| 6,750,727 | B1 | 6/2004 | Sutardja |

(Continued)

FOREIGN PATENT DOCUMENTS

JP     7-320942     8/1995

(Continued)

OTHER PUBLICATIONS

Zhang, G. et al., "New Broadband Tunable Monolithic Microwave Floating Active Inductor." Electronic Letters, vol. 28, No. 1, pp. 78-81, Jan. 2, 1992.

(Continued)

*Primary Examiner*—Henry Choe
(74) *Attorney, Agent, or Firm*—Finnegan, Henderson, Farabow, Garrett & Dunner, L.L.P.

(57) ABSTRACT

An amplifier comprises an amplifier circuit which comprises a first inductor as an impedance element for degeneration, and a control circuit which has a second inductor electromagnetically connected to the first inductor, and changes a control current flowing through the second inductor to change an inductance value of the first inductor, thereby changing amplification characteristics of the amplifier circuit.

4 Claims, 16 Drawing Sheets

U.S. PATENT DOCUMENTS 6,861,913 B1 * 3/2005 Herzel et al. ........... 331/117 R

FOREIGN PATENT DOCUMENTS

| JP | 8-162331 | 6/1996 |
| JP | 9-74319 | 3/1997 |
| JP | 2000-223317 | 8/2000 |
| JP | 2000-315919 | 11/2000 |
| JP | 2002-9544 | 1/2002 |

OTHER PUBLICATIONS

Fong, "Dual-Bank High-Linearity Variable-Gain Low-Noise Amplifiers for Wireless Applications," IEEE International Solid-State Circuits Conference (1999), pp. 224-225.

Notification of Reasons for Rejection issued by the Japanese Patent Office, mailed Nov. 21, 2006, in Japanese Application No. 2003-150977 and English translation of Notification.

* cited by examiner

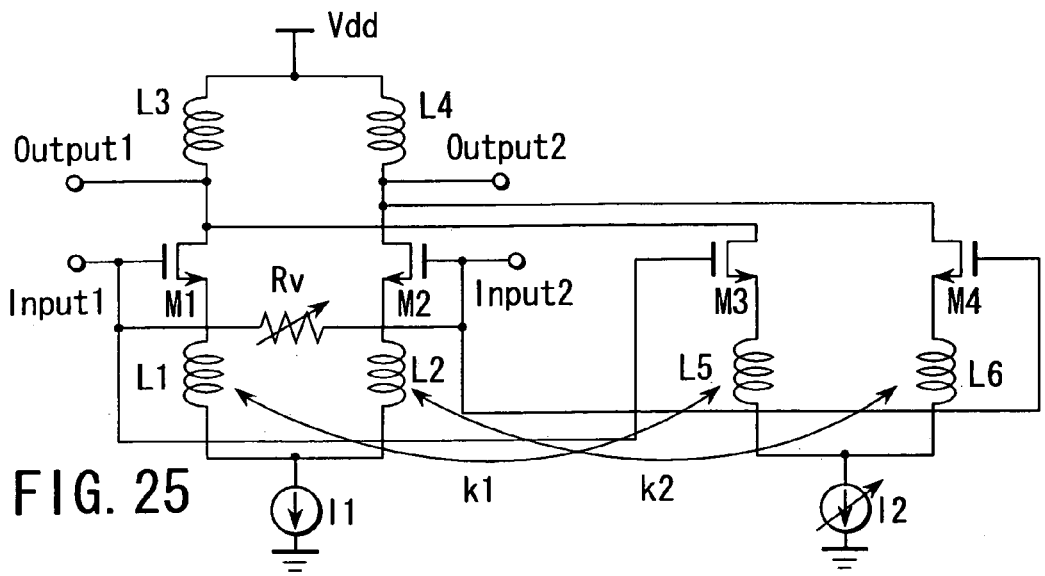
FIG. 25
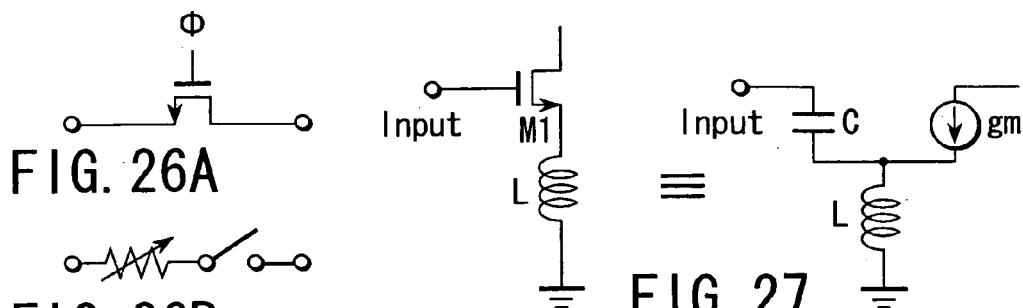
FIG. 26A
FIG. 26B
FIG. 27
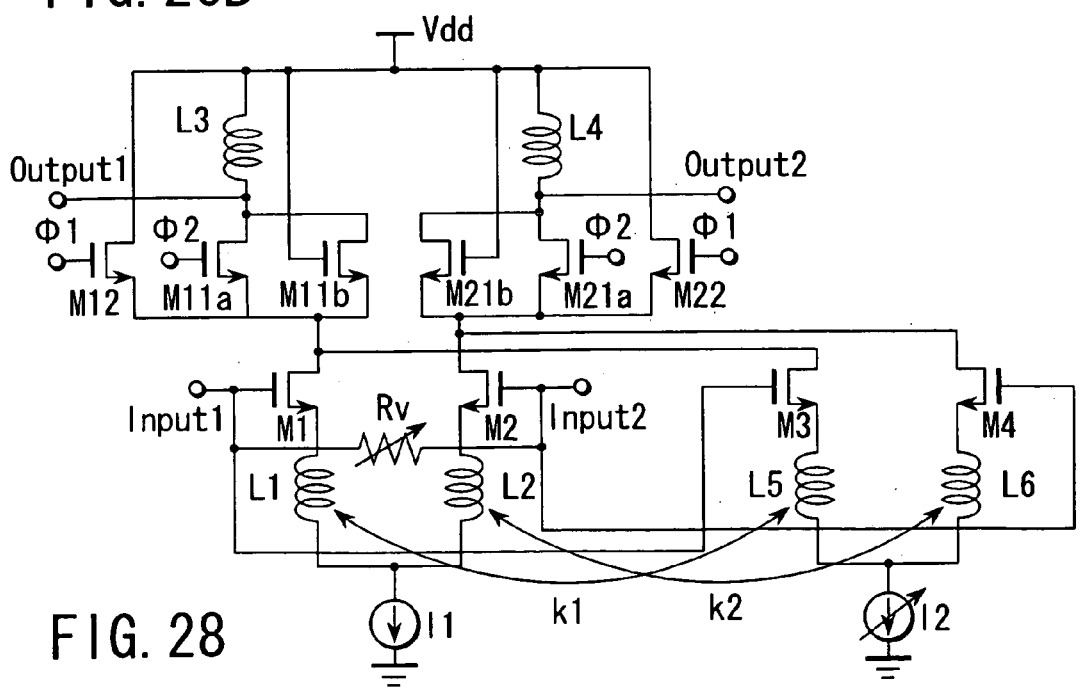
FIG. 28

VARIABLE INDUCTOR, OSCILLATOR INCLUDING THE VARIABLE INDUCTOR AND RADIO TERMINAL COMPRISING THIS OSCILLATOR, AND AMPLIFIER INCLUDING THE VARIABLE INDUCTOR AND RADIO TERMINAL COMPRISING THIS AMPLIFIER

CROSS-REFERENCE TO RELATED APPLICATIONS

This is a divisional of application Ser. No. 10/448,367, filed May 30, 2003 now U.S. Pat. No. 7,098,737, which is incorporated in its entirety herein by reference. This application is also based upon and claims the benefit of priority from the prior Japanese Patent Applications No. 2002-160621, filed May 31, 2002; No. 2002-188946, filed Jun. 28, 2002; and No. 2002-270984, filed Sep. 28, 2002, the entire contents of all of which are incorporated herein by reference.

BACKGROUND OF THE INVENTION

1. Field of the Invention

This invention relates to a variable inductor, and more particularly to a variable inductor which uses a circuit constituted of an active element and a plurality of interconnected inductors to change inductance.

Additionally, this invention relates to an oscillator having an inductor, and a radio terminal having an inductor, and also relates to improvements in a circuit designing technology of an amplifier and a radio terminal and a gain varying method of the amplifier.

2. Description of the Related Art

Generally, in order to vary characteristics of an electronic circuit, characteristics of an active element or a value of a passive element included in the circuit is changed. For the active element, the characteristics of the active element can be changed by changing a bias voltage applied to the active element. For the passive element, a passive element, for example, a variable resistive element can be easily realized by using ON resistance of a MOSFET, and a variable capacitive element can be easily realized by using a pn junction.

For an inductor as a passive element, it is generally considered difficult to vary inductance while maintaining good characteristics. A method which uses an active element to constitute an inductor and varies inductance is disclosed in ELECTRONICS LETTERS 2nd January, Vol. 28, No. 21, pp. 78 to 80, 1992. However, there is a problem of bad characteristics of noise or distortion because of use of the active element for the inductor.

Thus, various technologies have been presented, which vary inductance without constituting an inductor of an active element. However, all of these technologies have problems in practical application. For example, Jpn. Pat. Appln. KOKAI Publication No. 8-162331 discloses a method which inserts a switch into the middle of an inductor, and turns the switch ON/OFF to change inductance. This method has a problem that ON resistance of the switch deteriorates performance of the variable inductor.

Jpn. Pat. Appln. KOKAI Publication No. 2000-223317 discloses a method which physically changes a shape of an inductor by a laser beam. This method necessitates a physical adjustment of the inductor after it is manufactured. Thus, there are problems of high manufacturing costs and a difficulty of changing inductance in a situation where a circuit is operated.

Jpn. Pat. Appln. KOKAI Publication No. 7-320942 discloses a technology which constitutes a variable inductor by using interconnection of a plurality of inductors. According to this method, a shape of the inductor is physically changed in order to change a coupling coefficient. Thus, there are problems of miniaturization and low costs of a circuit which constitutes the variable inductor.

Further, D. R. Pehlke et al. have presented, in U.S. Pat. No. 5,994,985, a technology which uses a directional coupler to separate an input signal into two, and controls amplitudes and phases of signals flowing through two interconnected inductors to change inductance. However, since the directional coupler is not generally suited for integration, there is a problem that it is difficult to realize a variable inductor by an integrated circuit.

By realizing the variable inductor, it is also possible to control even a voltage-controlled oscillator (VOC) which includes an LC resonant circuit (inductor: inductance L, capacitor: capacity C). An oscillation frequency (f) of the voltage controlled oscillator which includes this LC resonant circuit is generally represented by $f=\frac{1}{2}[2\pi(LC)^{1/2}]$. If the inductance l or the capacity C is controlled, the oscillation frequency (f) is controlled. However, in the conventional LC resonant circuit, it is difficult to realize a variable inductor as described above. Generally, therefore, the capacity C is varied, for example, a reverse bias application voltage to a pn junction diode is changed to vary the capacity C and, by changing this capacity, the oscillation frequency is changed.

If such a voltage controlled oscillator is formed as an integrated circuit on a semiconductor substrate, i.e., IC formation, a parasitic capacitance, e.g., a parasitic capacitance of the inductor, a drain parasitic capacitance of a MOS transistor, a gate parasitic capacitance of the MOS transistor or the like, is generated. Generation of such a parasitic capacitance is inevitable, and thus there is a problem that such a parasitic capacitance reduces a fluctuation width in a variable capacity C of the LC resonant circuit. For example, if a fluctuation amount of the capacity C is $\Delta C$, a parasitic capacitance amount is added to a denominator as a non-fluctuation portion while a design fluctuation rate is assumed to be $\Delta C/C$. Thus, in practice, there is a problem that the fluctuation rate becomes small, i.e., $\Delta C/(C+\text{parasitic capacitance})$. Though it is dependent on a circuit design or the like, if the capacity C and the parasitic capacitance are about equal, a change rate is reduced to about ½.

Because of the presence of such a parasitic capacitance, a ratio of the capacity value of the LC resonant circuit occupied by the variable capacity C is inevitably reduced. Thus, compared with a change rate of the variable capacity C, a change in the capacity value of the LC resonant circuit is reduced and, consequently, a variable range of an oscillation frequency is narrowed.

Today, however, a frequency band used for a portable telephone, a radio LAN device or the like has been widened, and there is a case where a plurality of frequency bands are dealt with by one device. Thus, there has been an increase in demand for expansion of a change width of the oscillation frequency. From this viewpoint, realization of a variable inductor is desired.

The variable inductor can be applied to an amplifier provided with an inductor. For example, in an amplifier which comprises the inductor for degeneration, if its inductance is reduced, distortion characteristics are deteriorated while a gain and noise characteristics of the amplifier are improved. Conversely, if the inductance is increased, a gain and noise characteristics are deteriorated while distortion characteristics are improved. Because of this trade-off relation, an inductance value is decided to obtain desired characteristics when the amplifier is designed.

Generally, realization of low distortion characteristics while maintaining a high gain and low noise characteristics is dealt with by increasing the amount of a current. In the amplifier used for a receiver of a radio terminal, characteristics necessary for the amplifier are different depending on a sized of a received signal. Generally, since it is considered important to amplify a signal at low noise if the received signal is small, a good gain and good noise characteristics are required of the amplifier. On the other hand, if the received signal is large, good distortion characteristics are required.

In the conventional amplifier which comprises the inductor for degeneration, since inductance is fixed, the amount of a supplied current is controlled in order to change the characteristics of the amplifier. That is, to improve distortion characteristics, a current is controlled so as to increase the amount of a supplied current. However, an increase in the amount of a current made to change the characteristics of the amplifier creates a problem of increased power consumption.

Further, there is disclosed a circuit example of a variable gain amplifier in Dual-Band High-linearity Variable-Gain Low-Noise Amplifier for Wireless Applications K. L. Fong, "Dual-Band High-Linearity Variable-Gain Low-Noise Amplifier for Wireless Applications," IEEE ISSCC99, pp 224 to 225, 1999. In this variable gain amplifier, a first-stage common emitter circuit constituted of a first transistor Q1 is always operated, and gain switching is realized by switching second to fourth transistors Q2 to Q4 which constitute a first-stage common base circuit. Since the first transistor Q1 is operated, input impedance is not greatly changed even if a gain is switched. However, a fixed current is always consumed, and distortion characteristics are substantially constant.

However, in the conventional circuit disclosed in Dual-Band High-Linearity Variable-Gain Low-Noise Amplifier for Wireless Applications K. L. Fong, "Dual-Band High-Linearity Variable-Gain Low-Noise Amplifier for Wireless Applications," IEEE ISSCC99, pp 224 to 225, 1999, there is a problem that a large current is consumed even when a gain is low, and distortion characteristics are about similar to those when the gain is high. To realize an amplification stage of a basically high gain and good distortion characteristics, current consumption is necessary to a certain extent. In the case of a gain which is not so high or to attenuate a signal, it is possible to realize an amplification stage of good distortion characteristics without consuming a current so greatly. However, if a plurality of amplification stages are switched, there is a problem of a change in input impedance.

As described above, the variable inductor of the conventional art has a problem in electric characteristics, and there is a problem that it is difficult to realize miniaturization, low costs and an integrated circuit.

In the radio terminal such as a portable telephone, there is a strong demand for making an adaptive characteristic change of amplifier characteristics in accordance with a received signal level, while lower power consumption is similarly demanded strongly. In the amplifier which uses a fixed inductor for degeneration, the only way to improve distortion characteristics is to increase the amount of a current, which brings about an increase in power consumption.

BRIEF SUMMARY OF THE INVENTION

An object of the present invention is to provide a variable inductor which has good electric characteristics, allows easy miniaturization and low costs, and is suited to circuit integration.

According to an aspect of the present invention, there is provided a variable inductor comprising:

a signal input terminal which receives an input signal;

a distributor including first and second active elements, configured to vary a distribution ratio of first and second currents flowing through the first and second active elements, respectively;

output terminals which output the first and second currents, respectively; and a first inductor through which the first current flows;

a second inductor through which the second current flows and which is connected to the first inductor; and According to an another aspect of the present invention, there is also provided an oscillator comprising:

a voltage control oscillation circuit having a first inductor; and a frequency control circuit having a second inductor electro-magnetically coupled to the first inductor, configured to supply a control current to the second inductor, and controls an oscillation frequency of the voltage control oscillation circuit by changing the control current to change an inductance value of the first inductor.

According to an yet another aspect of the present invention, there is an amplifier comprising:

an amplifier circuit having a first inductor; and a control section having a second inductor electro-magnetically coupled to the first inductor, configured to supply a control current to the second inductor, and change the control current to change an inductance value of the first inductor, thereby changing amplification characteristics of the amplifier circuit.

According to an further aspect of the present invention, there is an amplifier comprising:

an input terminal which receives an input signal;

a variable gain amplification circuit configured to amplify the input signal with a variable gain of an amplification, which includes a plurality of amplification stages arranged in parallel; and an input impedance adjustment circuit including a variable resistor circuit connected to the input terminal, configured to adjust a resistance value of the variable resistor to compensate a change in input impedance in accordance with a change of the gain.

BRIEF DESCRIPTION OF THE SEVERAL VIEWS OF THE DRAWING

FIG. 25 is a circuit diagram showing another specific circuit of the differential amplifier shown in FIG. 23.

FIGS. 26A and 26B are views each showing a circuit example of a variable resistor shown in FIG. 25.

FIG. 27 is an equivalent circuit diagram showing an input impedance of amplification stages shown in FIGS. 24 and 25.

FIG. 28 is a circuit diagram showing a circuit of a modified example of a circuit shown in FIG. 25.

DETAILED DESCRIPTION OF THE INVENTION

Next, detailed description will be made of a variable inductor, an oscillator which incorporates the variable inductor in a circuit, a radio terminal which comprises this oscillator, an amplifier which incorporates the variable inductor in a circuit, and a radio terminal which comprises this amplifier according to the embodiments of the present invention with reference to the accompanying drawings.

The description will be made by way of example where an FET is used as a transistor which is an active element used for a distributor of a variable inductor circuit. However, a bipolar transistor can be used in place of the FET to realize the variable inductor circuit.

<Variable Inductor>
(First Embodiment)

Figure 1:
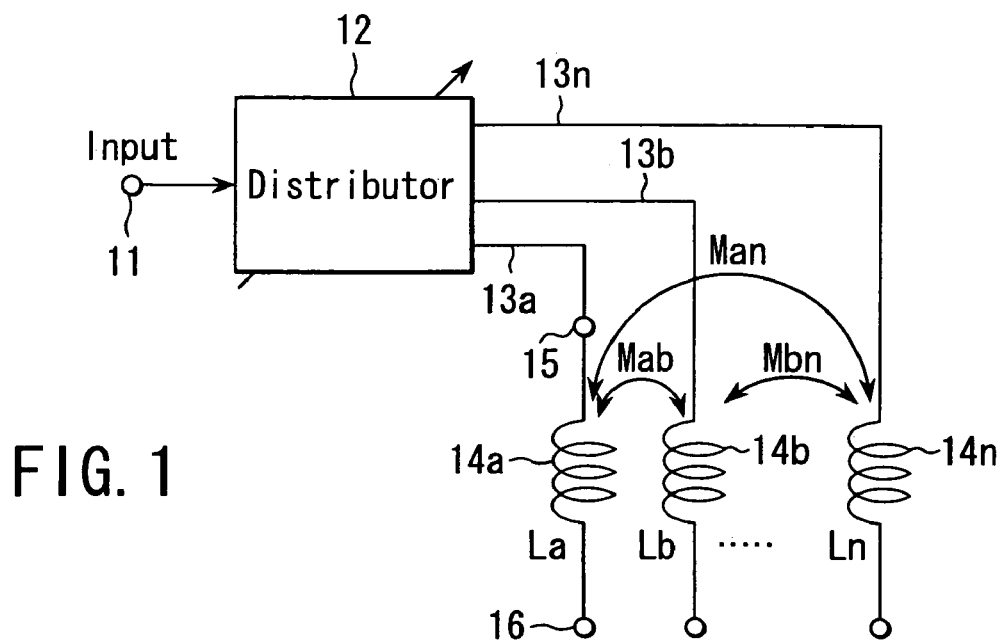
FIG. 1 is a circuit diagram schematically showing a variable inductor according to a first embodiment of the present invention.
Figure 2:
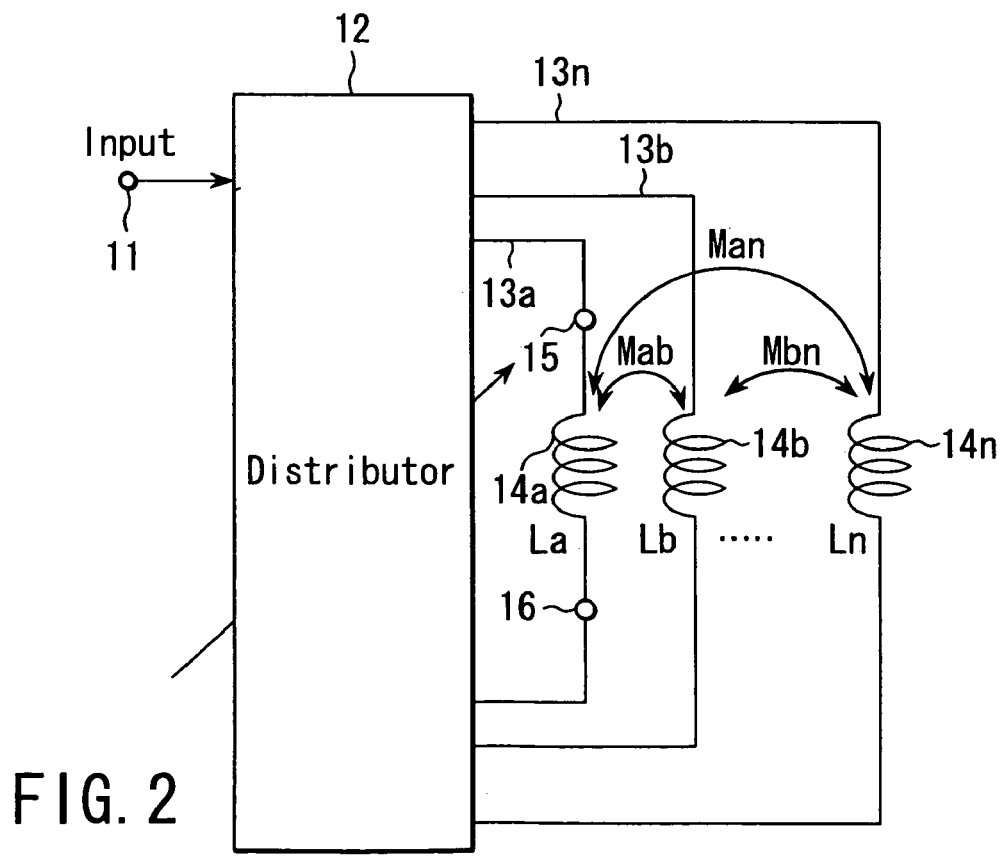
FIG. 2 is a circuit diagram schematically showing a modified example of the variable inductor shown in FIG. 1.

First, description will be made of a variable inductor according to a basic embodiment of the present invention. FIGS. 1 and 2 show circuitry of a viable inductor of a first embodiment of the present invention. An input signal (Input) input to a signal input terminal 11 is distributed to a plurality of signal paths 13a, 13b, . . . , 13n by a distributor 12 constituted by using an active element. Inductors 14a, 14b, . . . 14b are inserted into the signal paths 13a, 13b, . . . , 13n. The inductors 14a, 14b, . . . 14n are constituted of, e.g., spirally formed leads, and arranged close to one another to be interconnected.

The inductors 14a, 14b, . . . 14n generate magnetic fluxes depending on sizes of input signals, and each magnetic flux is applied on the other close inductor to interconnect each inductor with this other inductor. Thus, the inductors 14a, 14b, . . . 14n have self inductance caused by a magnetic flux generated by each inductor itself, and mutual inductance decided by a magnetic flux generated by the other inductor coupled with each inductor. For example, inductance of the inductor 14a, i.e., inductance between terminals 15, 16 (called variable inductor terminals) of both ends of the inductor 4a is decided by self inductance Lsa of the inductor 14a, and mutual inductance Mab, . . . , Man between the inductor 14*a* and the other inductors 14*b*, . . . 14*n*. Here, depending on directions of the interconnected inductors (direction considering both of current and winding wire directions), the interconnected inductors can be set in a relation of reinforcing or weakening magnetic fluxes generated by the inductors. Thus, the inductance La between the variable inductor terminals 15, 16 can be set large or small with respect to the self-inductance Lsa.

The signals distributed from the distributor 12 to the signal paths 13*a*, 13*b*, . . . , 13*n* are supplied to the inductors 14*a*, 14*b*, . . . 14*n*. Here, by adjusting a distribution ratio of the signals distributed from the distributor 12 to the inductors 14*a*, 14*b*, . . . 14*n*, the mutual inductance Mab, . . . , Man, i.e., the amount of a magnetic flux by interconnection of the inductors 14*a*, 14*b*, . . . 14*n*, can be controlled. Thus, the inductance between the variable inductor terminals 15, 16 can be set to a desired value.

The distributor 12 is constituted of an active element such as a transistor as described later. Accordingly, different from the conventional variable inductor circuit which uses the directional coupler, the distributor 12 shown in FIGS. 1 and 2 can be easily formed into an integrated circuit. In the circuit shown in FIG. 1, the distributor 12 is connected between the signal input terminal 11 and one end of each of the inductors 14*a*, 14*b*, . . . 14*n*. In the circuit shown in FIG. 2, one end and the other end of each of the inductors 14*a*, 14*b*, . . . 14*n* are connected to the distributor 12.

Next, some more specific embodiments of the variable inductor shown in FIGS. 1 and 2 will be described.

(Second Embodiment)

Figures 3, 4:
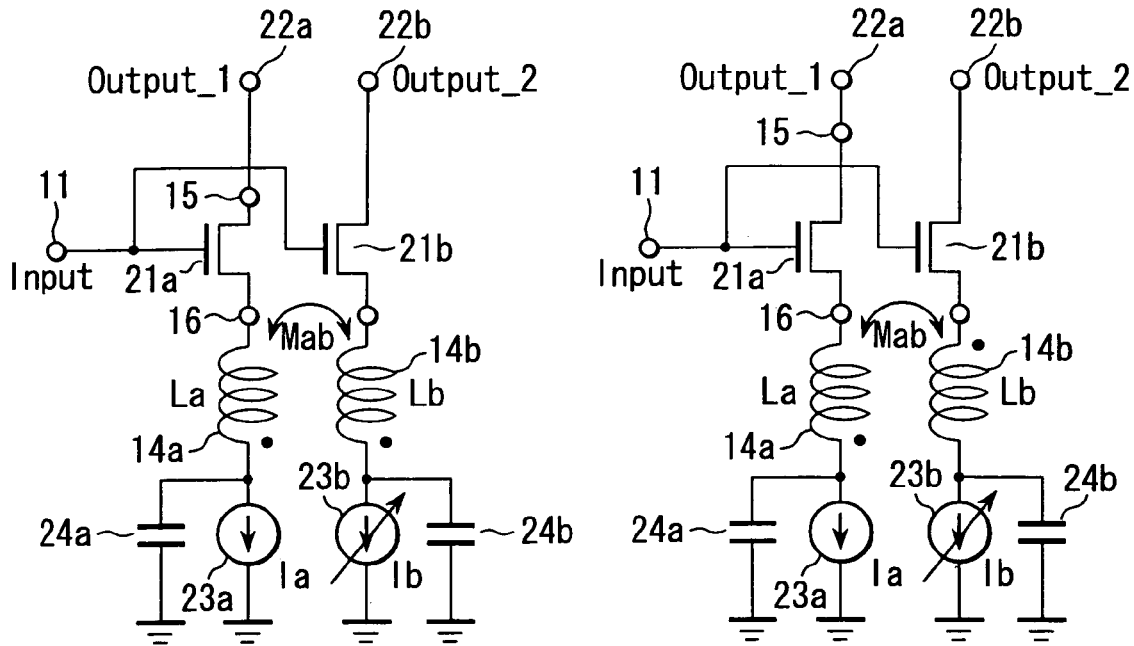
FIG. 3 is a circuit diagram schematically showing a variable inductor according to a second embodiment of the present invention.
FIG. 4 is a circuit diagram schematically showing a modified example of the variable inductor shown in FIG. 3.

FIGS. 3 and 4 show a variable inductor where the distributor 12 includes a common source circuit according to the embodiment. The circuit of this embodiment is equivalent to the specific circuit example of the basic circuitry shown in FIG. 1. The input signal from the signal input terminal 11 is amplified by a common source circuit, e.g., MOSFET's (simply referred to as transistor, hereinafter) 21*a*, 21*b* to be distributed to two signal paths, and supplied to the inductors 14*a*, 14*b* inserted into these signal paths. Gate terminals of the transistors 21*a*, 21*b* are connected to the signal input terminal 11, source terminals are connected to ends of the inductors 14*a*, 14*b*, and drain terminals are connected to output terminals 22*a*, 22*b* of the variable inductor. In this variable inductor, signal currents amplified by the MOSFET's 21*a*, 21*b* are outputted from output terminals 22*a*, 22*b* of the variable inductor.

The other ends of the inductors 14*a*, 14*b* are connected to ends of power sources 23*a*, 23*b* and ends of capacitors 24*a*, 24*b*, and grounded with respect to AC components (high frequency components). The other ends of the power sources 23*a*, 23*b* and the other ends of the capacitors 24*a*, 24*b* are connected to the ground. Among currents flowing through the inductors 14*a*, 14*b*, DC components flow through the power sources 23*a*, 23*b*, and AC components (high frequency components) are bypassed by the capacitors 24*a*, 24*b*.

In the variable inductor shown in FIGS. 3 and 4, black points given near symbols indicating the inductors 14*a*, 14*b* represent winding start positions of the inductors. In the inductors where these positions are the same, directions of all the winding wires thereof are the same, and phases of magnetic fluxes are the same.

If the directions of the inductors 14*a*, 14*b* are the same as shown in FIG. 3, magnetic flues are generated in reinforcing directions in the inductors 14*a*, 14*b*. Thus, if self inductance of the single inductor 14*a* is Lsa, self inductance of the single inductor 14*b* is Lsb, and an coupling coefficient between the inductors 14*a*, 14*b* is kab, effective inductance of the inductor 14*a* considering interconnection, i.e., inductance La between the variable inductor terminals 15, 16 is represented by the following equation (1):

$$La = Lsa + kab \cdot Lsb \qquad (1)$$

If mutual inductance between the inductors 14*a*, 14*b* is Mab, the equation (1) is represented by the following equation (2):

$$La = Lsa + Mab \qquad (2)$$

On the other hand, if the directions of the inductors 14*a*, 14*b* are opposite as shown in FIG. 4, magnetic fluxes are generated in a weakening relation in the inductors 14*a*, 14*b*. This inductance La is represented by the following equation (3) or (4):

$$La = Lsa - kab \cdot Lsb \qquad (3)$$

$$La = Lsa - Mab \qquad (4)$$

Here, the coupling coefficient kab, i.e., mutual inductance Mab, is decided based on a physical arrangement of the inductors 14*a*, 14*b*, sizes of the transistors 21*a*, 21*b*, current values Ia, Ib or the power sources 23*a*, 23*b* etc. Thus, even without changing the physical arrangement of the inductors 14*a*, 14*b*, by adjusting the current values Ia, Ib or the sizes of the transistors 21*a*, 21*b*, a value of the inductance La can be varied.

For example, the current source 23*b* is set as a variable current source which can control the current value Ib by a control signal from the outside, and this current value Ib is continuously changed. Accordingly, the mutual inductance Mab is changed. Thus, the inductance La between the variable inductor terminals 15, 16 is continuously changed. When the power source 23*b* is turned ON/OFF, the inductance La can be switched between (Lsa+Mab) or (Lsa−Mab) and Lsa in a binary manner.

According to the embodiment shown in FIGS. 3 and 4, the common source circuit by the FET is used for the distributor 12. However, a common emitter circuit by a bipolar transistor can also be used. In the case of the emitter-grounded circuit, the gate terminal, the drain terminal and the source terminal of the FED are replaced by a base terminal, a collector terminal and an emitter terminal of the bipolar transistor. In the circuit shown in FIGS. 1 and 2, the two inductors are used. However, even for a circuit which uses three or more inductors, a constitution similar to the embodiment can be applied.

Moreover, as a modified example, the distributor 12 may be constituted of a plurality of transistors where gate or base terminals of distributors are connected in common to the signal input terminal 11 through at least one inductor of the plurality of inductors. As another modified example of the embodiment, the distributor 12 may be constituted of a plurality of transistors where gate or base terminals are connected in common to the signal input terminal 11, and drain or collector terminals are connected to ends of the plurality of inductors.

(Third Embodiment)

Figure 5:
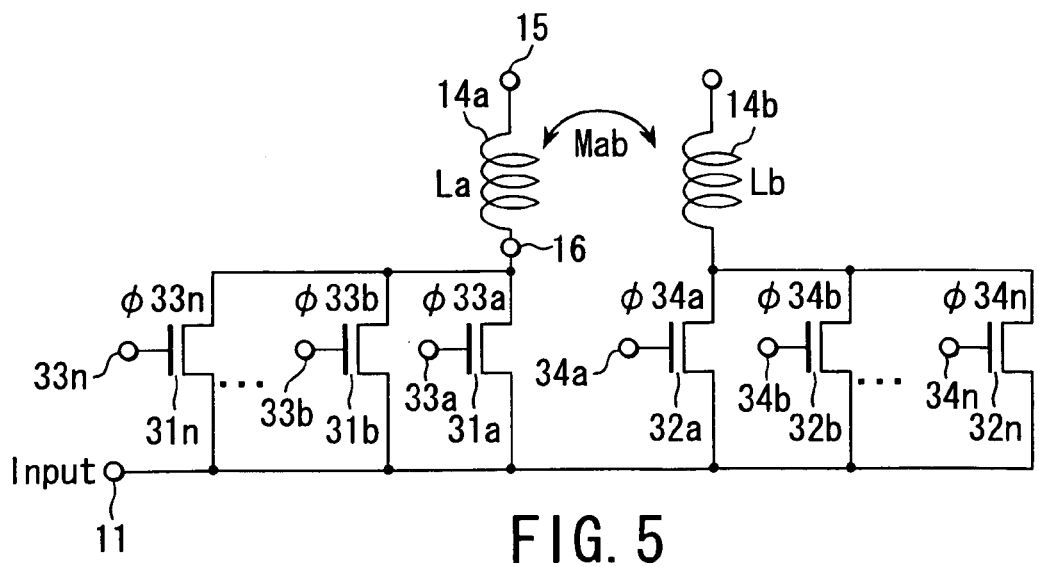
FIG. 5 is a circuit diagram schematically showing a variable inductor according to a third embodiment of the present invention.

FIG. 5 shows a variable inductor according to a third embodiment which uses a transistor circuit where a gate is grounded to a distributor 12. A source terminal of at least one of first transistors 31*a*, 31*b*, . . . , 31*n*, and source terminals of a plurality of second transistors 32*a*, 32*b*, . . . , 32*n* are connected to a signal input terminal 11. Drain terminals of the first transistors 31*a*, 31*b*, . . . , 31*n* are connected to one end of a first inductor 14*a*, and gate terminals are connected to control signal input terminals 33a, 33b, ..., 33n. Drain terminals of the second transistors 32a, 32b, ..., 32c are connected in common to one end of a second inductor 14b, and gate terminals are connected to control signal input terminals 34a, 34b, ..., 34n.

Control signals φ33a, φ33b, ..., φ33n are input to the control signal input terminals 33a, 33b, ..., 33c. Control signals φ34a, φ34b, ..., φ34n are input to the control signal input terminals 34a, 34b, ..., 34c. When the control signals φ33a, φ33b, ..., φ33n and φ34a, φ34b, ..., φ34b are changed in a binary manner, a distribution ratio of signal levels to the inductors 14a, 14b, i.e., a ratio of currents flowing through the inductors 14a, 14b, is changed. Thus, mutual inductance Mab between the inductors 14a, 14b is changed and, as a result, effective inductance La (inductance between terminals 15, 16) of the inductor 14a can be changed.

A distribution ratio of a signal level to the inductor 14a is decided based on the number of transistors turned ON by the control signals φ33a, φ33b, ..., φ33n among the transistors 31a, 31b, ..., 31c. Similarly, a distribution ratio of a signal level to the inductor 14b is decided based on the number of transistors turned ON by the control signals φ34a, φ34b, ..., φ34n among the transistors 32a, 32b, ..., 32c.

The inductance La between the terminals 15, 16 may be continuously changed by setting the control signals φ33a, φ33b, ..., φ33n, and φ34a, φ34b, ..., φ34n as analog signals and continuously changing currents flowing through the transistors 31a, 31b, ..., 31n and the transistors 32a, 32b, ..., 32c.

In FIG. 5, the plurality of transistors 31a, 31b, ..., 31n are connected to the inductor 14a. However, if a small variable range of inductance is allowed, the number of first transistors may be one. Similarly, the plurality of second transistors 32a, 32b, ..., 32n are connected to the inductor 14b. However, if a small variable range of inductance is allowed, the number of second inductors may be one.

In the variable inductor of the embodiment, the common gate circuit by the FET is used for the distributor 12. However, a common base circuit by a bipolar transistor can also be used. In the case of the base-grounded circuit, the gate terminal, the drain terminal and the source terminal of the FED are replaced by a base terminal, a collector terminal and an emitter terminal of the bipolar transistor.

Moreover, as a modified example, the distributor 12 may be constituted of at least one first transistor where a source or emitter terminal is connected to the signal input terminal 11 through at least one first inductor, and a gate or base terminal is connected to the control signal input terminal, and at least one second transistor where a source or emitter terminal is connected to the signal input terminal 11 through the first inductor, a drain or collector terminal is connected to one end of at least one second inductor coupled to the first inductor, and a gate or base terminal is connected to the control signal input terminal.

(Fourth Embodiment)

Figure 6:
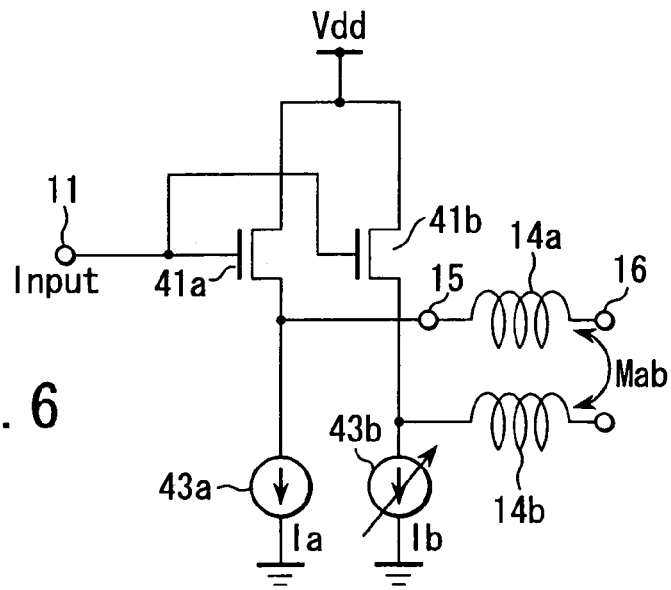
FIG. 6 is a circuit diagram schematically showing a variable inductor according to a fourth embodiment of the present invention.

FIG. 6 shows a variable inductor according to a fourth embodiment of the present invention which uses a source follower circuit for a distributor 12. Gate terminals of a plurality of transistors 41a, 41b (two in the example of FIG. 6) are connected to a signal input terminal 11. Drain terminals of the transistors 41a, 41b are connected to a power source Vdd which is a constant potential point, and source terminals are connected to ends of inductors 14a, 14b. Further, current sources 43a, 43b are connected to the source terminals of the transistors 41a, 41b. Thus, the transistors 41a, 41b operate as source follower circuits.

Here, as in the case of the second embodiment, if the current source 43a is set as a variable current source which can control a current value Ib by a control signal from the outside, and this current value Ib is continuously changed, mutual inductance Mab between the inductors 14a, 14b is accordingly changed, whereby inductance La between the terminals 15, 16 is continuously changed. When the current source 43b is turned ON/OFF, the inductance La is switched between (Lsa+Mab) or (Lsa−Mab) and Lsa in a binary manner where self-inductance of the inductor 14a is set as Lsa.

According to the embodiment, the source follower circuit by the FET is used for the distributor 12. However, it is apparent that an emitter follower circuit by a bipolar transistor can also be used.

Further, as a modified example of the embodiment, the distributor 12 may be constituted of a plurality of transistors where gate or base terminals are connected to the signal input terminals 11 through the inductors, and the drain or collector terminals are connected to the constant potential point.

(Fifth Embodiment)

Figure 7:
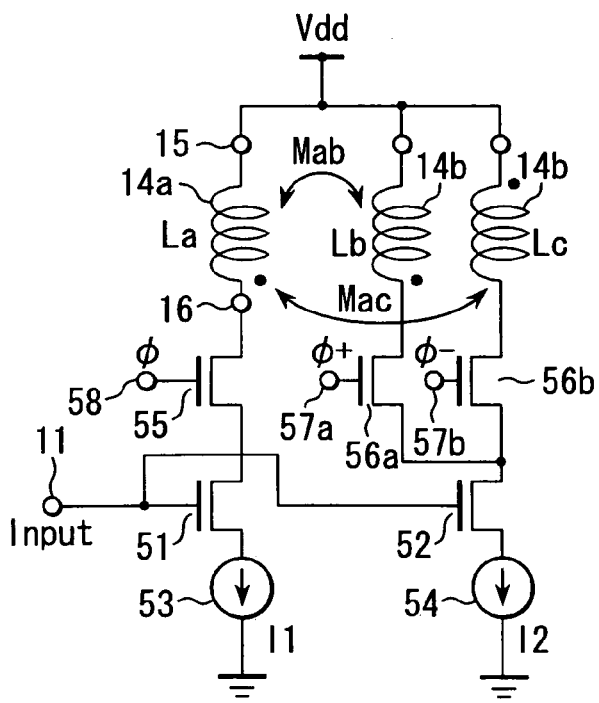
FIG. 7 is a circuit diagram schematically showing a variable inductor according to a fifth embodiment of the present invention.

FIG. 7 shows a variable inductor of a fourth embodiment of the present invention which uses cascode-connected circuits for a distributor 12. Gate terminals of first and second transistors 51, 52 are connected to a signal input terminal 11. Source terminals of the transistors 51, 52 are connected to current sources 53, 54. A drain terminal of the first transistor 51 is connected to a source terminal of a third transistor 55, and a drain terminal of the second transistor 52 is connected in common to source terminals of a plurality of fourth transistors 56a, 56b (two in the example of FIG. 7). That is, the transistor 51 and the transistor 55 are cascode-connected, and the transistor 52 and the transistors 56a, 56b are cascode-connected.

Drain terminals of the third transistor 55 and the fourth transistors 56a, 56b are connected to ends of inductors 14a, 14b, 14c. A gate terminal of the third transistor 55 is connected to a control signal input terminal 58, and gate terminals of the fourth transistors 56a, 56b are connected to control signal input terminals 57a, 57b. As indicated by black points given near symbols of the inductors 14a, 14b, 14c, the inductor 14b is arranged in a magnetic flux reinforcing direction, and the inductor 14c is arranged in a magnetic flux weakening direction with respect to the inductor 14a.

Now, in a state where a control signal φ is input to the control signal input terminal 58 to turn ON the transistor 55, if a control signal φ+ is input to the control signal input terminal 57a and a control signal φ− is input to the control signal input terminal 57b to turn ON the transistor 56a connected to the inductor 14b and turn OFF the transistor 56b connected to the inductor 14c, inductance La between both ends 15, 16 of the inductor 14a becomes larger than self inductance Lsa of the inductor 14a. Conversely, if a control signal φ− is input to the control signal input terminal 57a and a control signal φ+ is input to the control signal input terminal 57b to turn OFF the transistor 56a and turn ON the transistor 56b, inductance La between both ends 15, 16 of the inductor 14a becomes smaller compared with self inductance Lsa.

Thus, by using the cascode-connected circuits for the distributor 12, the fourth transistors 56a, 56b cascode-connected to the second transistor 52 are turned ON/OFF to selectively supply signals to the inductors 14b, 14c. As a result, the inductance La between the terminals 15, 16 can be increased/decreased.

According to the embodiment, the cascode-connected circuits by the FET are used for the distributor 12. However, it is apparent that cascode-connected circuits by a bipolar transistor can also be used.

(Sixth Embodiment)

Figure 8:
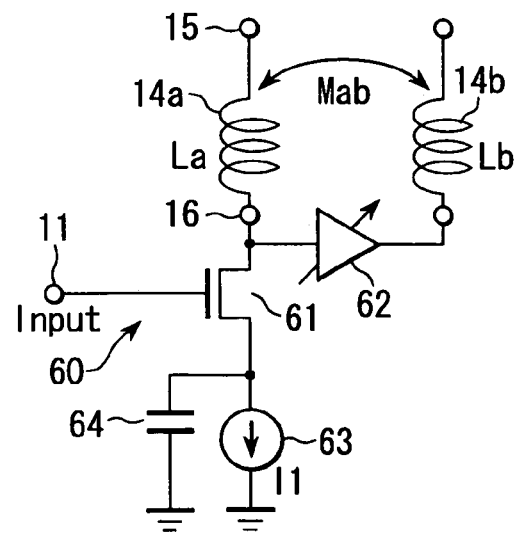
FIG. 8 is a circuit diagram schematically showing a variable inductor according to a sixth embodiment of the present invention.

FIG. 8 shows a variable inductor according to a fifth embodiment of the present invention. A gate terminal of a transistor 61 which constitutes an amplifier 60 is connected to a signal input terminal 11. A current source 63 and an AC (high frequency) bypass capacitor 64 are connected to a source terminal of the transistor 61. One end of an inductor 14a and an input terminal of a buffer circuit 62 are connected to a drain terminal of the transistor 61, and one end of the other inductor 14b is connected to an output terminal of the buffer circuit 62.

The buffer circuit 62 is constituted of a circuit formed on an integrated circuit, e.g., a common source circuit or a source follower circuit, and its gain is varied. By changing a gain of the buffer circuit 62, a distribution ratio of signal levels to the inductors 14a, 14b is changed as in the cases of the aforementioned embodiments. Accordingly, mutual inductance is changed to enable a change in inductance between variable inductor terminals 15, 16.

According to the embodiment, the FET is used for the transistor 61 in the distributor 12. However, as in the cases of the aforementioned embodiments, a bipolar transistor may be used.

(Seventh Embodiment)

Figure 9:
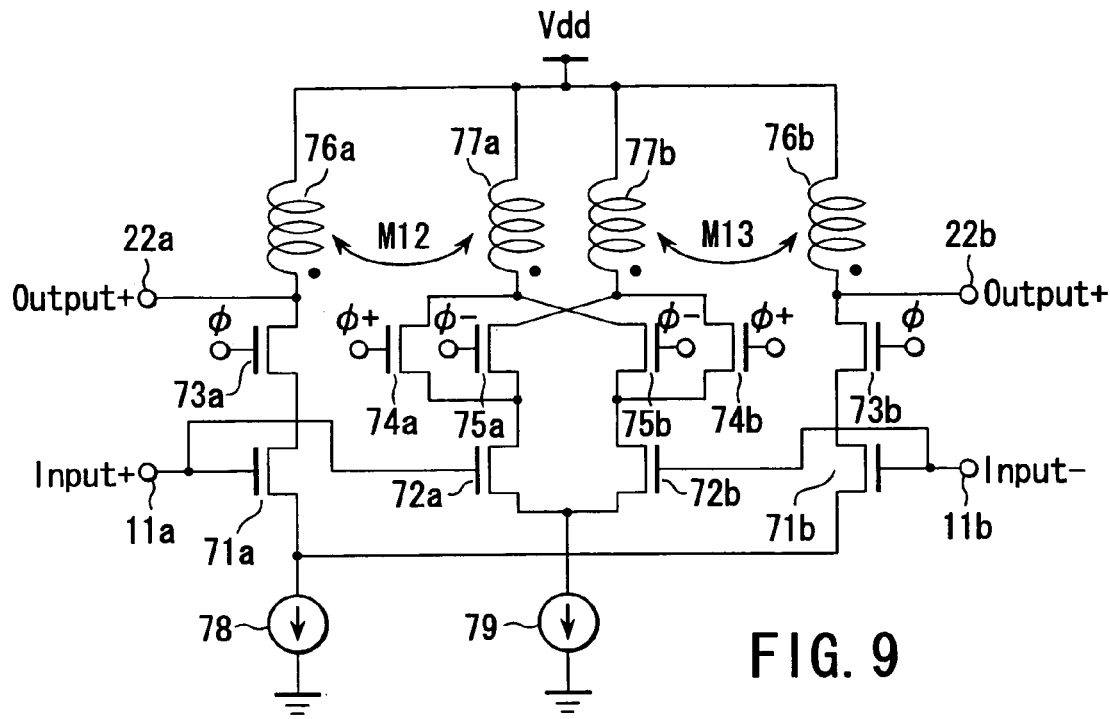
FIG. 9 is a circuit diagram schematically showing a variable inductor according to a seventh embodiment of the present invention.

The embodiments have been described by way of case where the distributors 12 are all in single-end circuitry. However, the distributor 12 may be constituted of a differential circuit. As a variable inductor of a seventh embodiment of the present invention, an example where the distributor 12 is constituted of a differential circuit is shown in FIG. 9. In the circuit shown in FIG. 9, a differential amplifier cascode-connected to the distributor 12 is used.

Gate terminals of differential pair transistors 71a, 71b and gate terminals of differential pair transistors 72a, 72b are connected to differential input terminals 11a, 11b. A source terminal of the differential pair transistors 71a, 71b is connected to a current source 78, and drain terminals of the differential pair transistors 72a, 72b are connected to a current source 79. Drain terminals of the differential pair transistors 71a, 71b are connected to source terminals of transistors 73a, 73b, and the drain terminals of the differential pair transistors 72a, 72b are connected to source terminals of transistors 74a, 74b and source terminals of transistors 75a, 75b.

Gate terminals of the transistors 73a, 73b, 74a, 74b, 75a, 75b are connected to a control signal input terminal. Drain terminals of the transistors 73a, 73b are connected to differential output terminals 22a, 22b, and to ends of inductors 76a, 76b. Drain terminals of the transistor 74a and the transistor 75b are connected in common to one end of an inductor 77a. Drain terminals of the transistor 74b and the transistor 75a are connected in common to one end of an inductor 77b. The other ends of the inductors 76a, 76b, 77a, 77b are connected to a power source Vdd which is a constant potential point.

Signals Input+, Input− opposite to each other in phase are input to the differential input terminals 11a, 11b. The entry of the signals Input+, Input− opposite to each other in phase is equivalent to reversal of codes of mutual inductance M12 between the inductors 76a, 77a and mutual inductance M13 between the inductors 76b, 77b. Accordingly, by control signals φ+ and φ−, interconnection for mutual inductance M12 and M13 can be controlled in magnetic flux reinforcing direction and in a magnetic flux weakening direction. Thus, the inductor can be changed.

Figure 10:
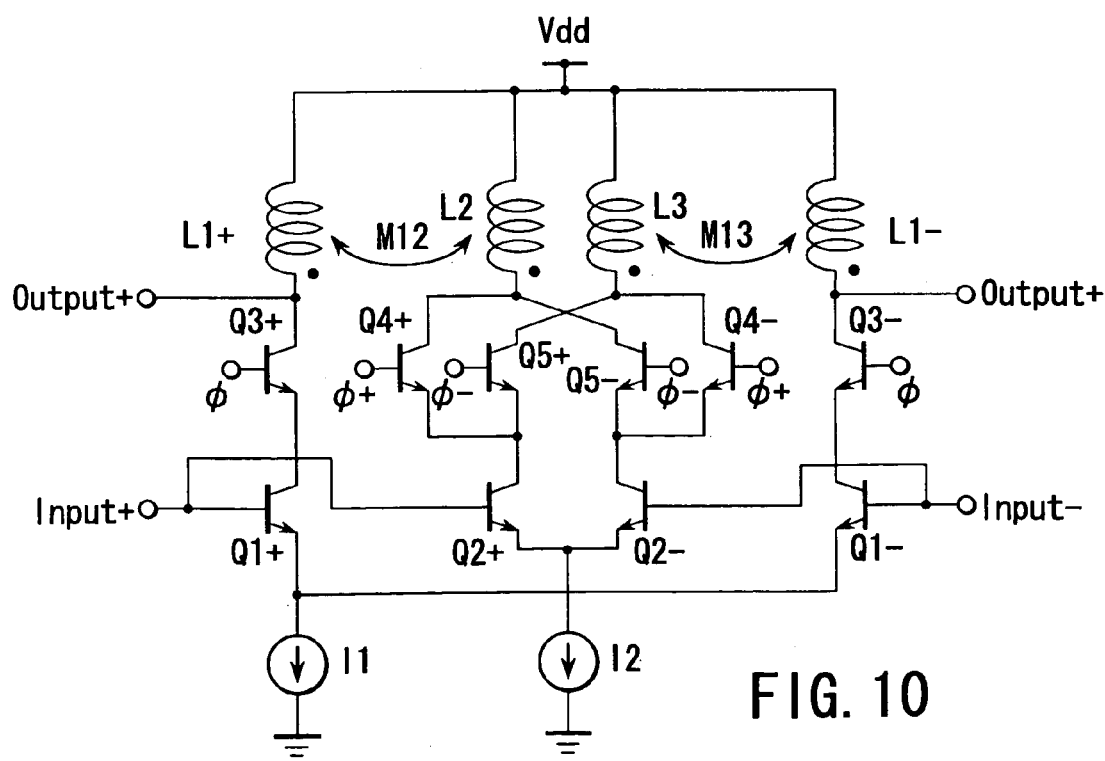
FIG. 10 is a circuit diagram schematically showing a variable inductor according to a modification of a seventh embodiment of the present invention.

FIG. 10 shows a distributor provided with a differential circuit according to a modification of the circuit configuration shown in FIG. 9, in which bipolar transistors are used instead of the FETs. The distributor shown in FIG. 10 can be operated in a same manner as that of FIG. 9, even if the different type transistors are incorporated in the distributor.

As described above, according to the variable inductor of the embodiment of the present invention, it is possible to electro-magnetically change the inductor by using the distributor to be formed on the integrated circuit. Moreover, such a variable inductor is suited for integrated circuit formation because of good electric characteristics, easy miniaturization and easy achievement of low costs.

<Oscillator Comprising Variable Inductor and Radio Terminal Comprising this Oscillator>

Next, description will be made of an oscillator which incorporates the aforementioned variable inductor of the present invention, and a radio terminal which comprises this oscillator.

Figure 11:
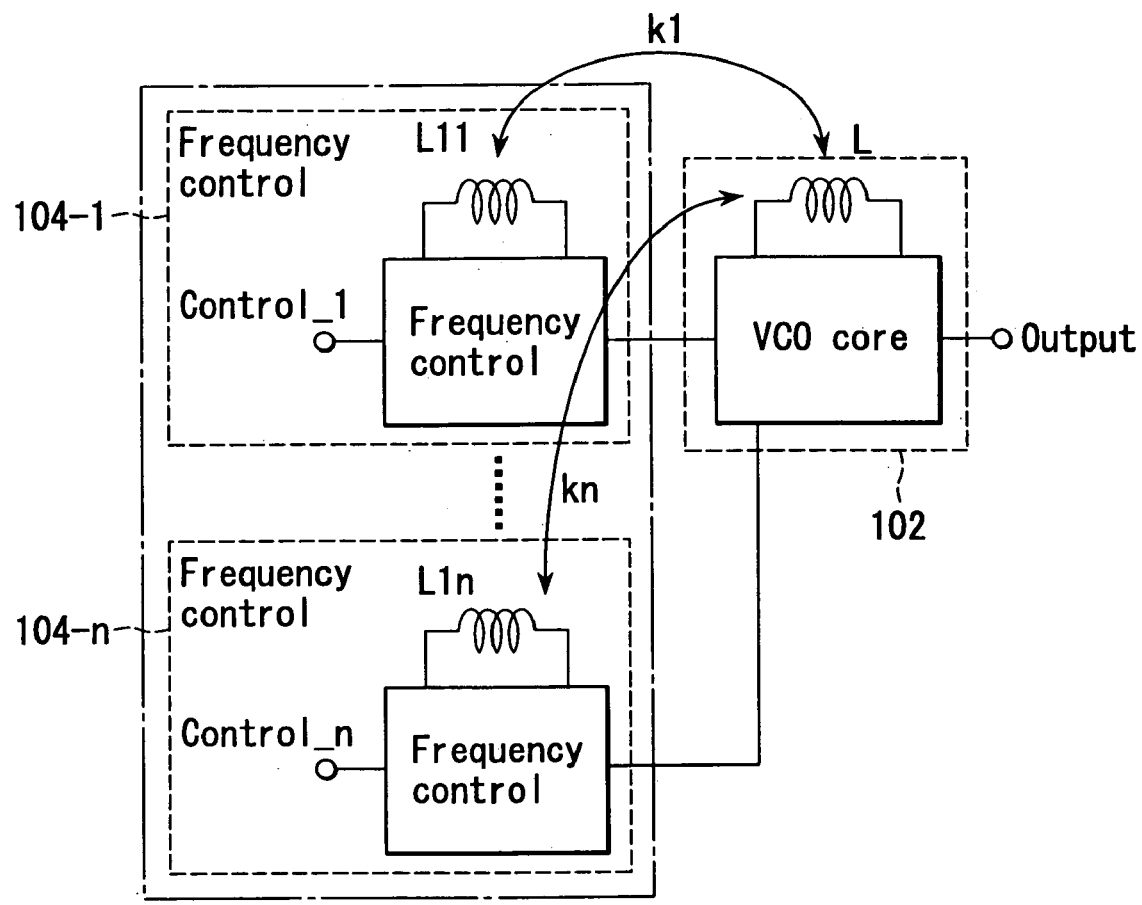
FIG. 11 is a block diagram schematically showing an oscillator according to an embodiment of the present invention.

FIG. 11 is a block diagram schematically showing an oscillator according to an embodiment of the present invention.

The oscillator shown in FIG. 11 comprises a core circuit section (VCO core) 102 which includes an LC resonant circuit having an inductor L0, and an oscillation frequency control section 104-1 (frequency controller) which has an inductor L11 to be electro-magnetically coupled to the inductor L0 based on a coupling coefficient k1 and can control a current supplied to the inductor L11.

A control signal Control_1 is input to the oscillation frequency control section 104-1 and, in accordance with this control signal Control_1, at least one or both of an amplitude and a phase of a current flowing through the inductor L11 is changed. As a result, inductance of the inductor L0 of the core circuit section 102 coupled to the inductor L11 is changed to cause a change in an oscillation frequency. For example, when a current of a direction where a magnetic flux is generated in a reinforcing direction with a magnetic flux generated in the inductor L0 flows through the inductor L11, a value of inductance of the inductor L0 becomes large, and an oscillation frequency becomes small in proportion to −½ square of the value of the inductance. When a current of a direction where a magnetic flux generated in the inductor L0 is weakened flows through the inductor L11, a value of inductance of the inductor L0 becomes small and, as a result, an oscillation frequency becomes large. By setting the currents flowing through the inductor L0 and the inductor L11 in the same direction to control current amplitudes, an increase/decrease of the inductor L0 can be controlled.

Generally, a control range of a frequency obtained by varying a capacity C is about C max/C min=2. On the other hand, in the system of changing inductance, for example, if currents flowing through the inductor L and the inductor L11 are set to equal values, and k=about 0.7 is set, L min=(1−k)L, L max=(1+k) are established to realize a large fluctuation range of L max/L min=about 6.

Normally, to change an oscillation frequency by a variable capacity, only a change in a range of 5 to 10% of an oscillation frequency is obtained. However, in the oscillator, which comprises the variable inductor as shown in FIG. 11, an oscillation frequency can be changed to a range of 50% to 100%.

The number of inductors L11 is not limited to one. As shown in FIG. 11, a plurality of inductors L11 to L1n, e.g., inductors L11, may be disposed. In the circuit shown in FIG. 11, n pieces of oscillation frequency control sections 104-n are disposed, and inductors L11 to L1n of the oscillation frequency control sections are electro-magnetically coupled to the inductor L of the VCO circuit 102 based on coupling coefficients (k1 to kn).

If it is only one inductor L11 that is electro-magnetically coupled to one oscillation frequency control section 104-1, i.e., the inductor L of the core circuit section 102, by changing an amplitude or a phase of a current flowing through the inductor L11, it is possible to change an inductance value of the inductor L.

In the circuit which comprises the plurality of inductors L11 to L1n, the VCO circuit 102 can be controlled on various modes. For example, even if a coupling coefficient is equal to that of the inductor L11 and a current identical to that which flows through the inductor L11 flows through the inductor L1n, the number of inductors L1n through which the current is turned ON/OFF to flow may be changed to change the activated inductor L1n electro-magnetically coupled to the inductor L.

The inductors L11 to L1n having different coupling coefficients k1 to kn can be prepared to be switched to be used. Further, currents flowing through the individual inductors L11 to L1n are changed to enable more meticulous control of the core circuit section 102.

Figure 12:
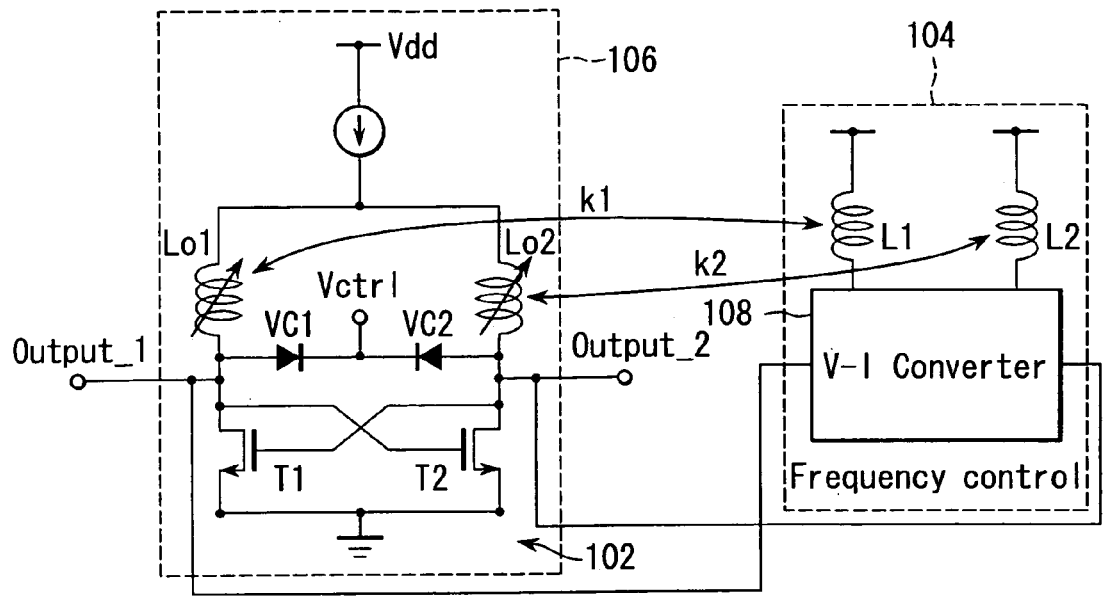
FIG. 12 is a block diagram schematically showing an oscillator according to another embodiment of the present invention.

FIG. 12 shows a circuit example where an oscillation signal (voltage signal) is input from a voltage control oscillation circuit 106 of a differential LC resonant type equivalent to the VCO core circuit 102 to the oscillation frequency control circuit 104, and this oscillation signal is subjected to voltage-current conversion to be supplied to the inductors L1, L2 coupled to the inductors L01, L02 of the core circuit section 102.

In the circuit shown in FIG. 12, one end of the inductor L01 is connected to the current source having a power supply voltage Vdd, and the other end is connected to a variable capacitor VC1 which comprises a drain and a diode of a MOS transistor T1. A source of this MOS transistor T1 is grounded.

Similarly, one end of the inductor L02 is connected to the current source having the power supply voltage Vdd, and the other end is connected to a variable capacitor VC2 which comprises a drain and a diode of a MOS transistor T2. A source of this MOS transistor T2 is grounded.

The drain of the MOS transistor T1 is connected to a gate of the MOS transistor T2, and similarly a drain of the MOS transistor T2 is connected to a gate of the MOS transistor T1.

A capacity control voltage Vctrl is supplied to the variable capacitors VC1, VC2 to decide capacities thereof. A resonance frequency is determined in accordance with parallel connections (L1–VC1), (L20VC2) of the variable capacitors VC1, VC2 and the inductors L1, L2.

In FIG. 12, the variable capacitors VC1, VC2 are used. However, fixed capacity capacitors may be used. In the case of using the fixed capacity capacitors, only a fluctuation portion of frequency control dependent on the variable capacitors VC1, VC2 is eliminated, and there are no changes in operation.

From the oscillator 106, an output 1 (Output_1) from the drain of the MOS transistor T1 and an output 2 (Output_2) from the drain of the MOS transistor T2 are outputted.

In order to change an oscillation frequency of the output signal, the output 1 and the output 2 (Output_1, Output_2) are input to a current-voltage conversion circuit (V-I converter) 108 of the oscillation frequency control circuit 104 to control currents flowing through the inductor L1 electro-magnetically coupled to the inductor L01 based on a coupling coefficient k1 and through the inductor L2 electromagnetically coupled to the inductor L02 based on a coupling coefficient k2.

Here, it is assumed that k1=0.7, k2=0.7 are set, inductance values of the inductors (L01, L02, L1, L2) are equal at L, and currents of equal sizes flow through the inductors.

If a current between the electro-magnetically coupled inductors is in a magnetic field reinforcing direction, an inductance value of the inductor L01 is increased from L0 to 1.7L0.

If a current flows in a magnetic field weakening direction, an inductance value of the inductor L01 is reduced to 0.3L0.

Accordingly, it can be understood that if a lower part of an oscillation frequency is near fLo=2 GHz, a higher part thereof becomes fHi=(0.3/1.7)−½·fLo, and thus an oscillation frequency of 4 GHz or higher can be obtained.

Figure 13:
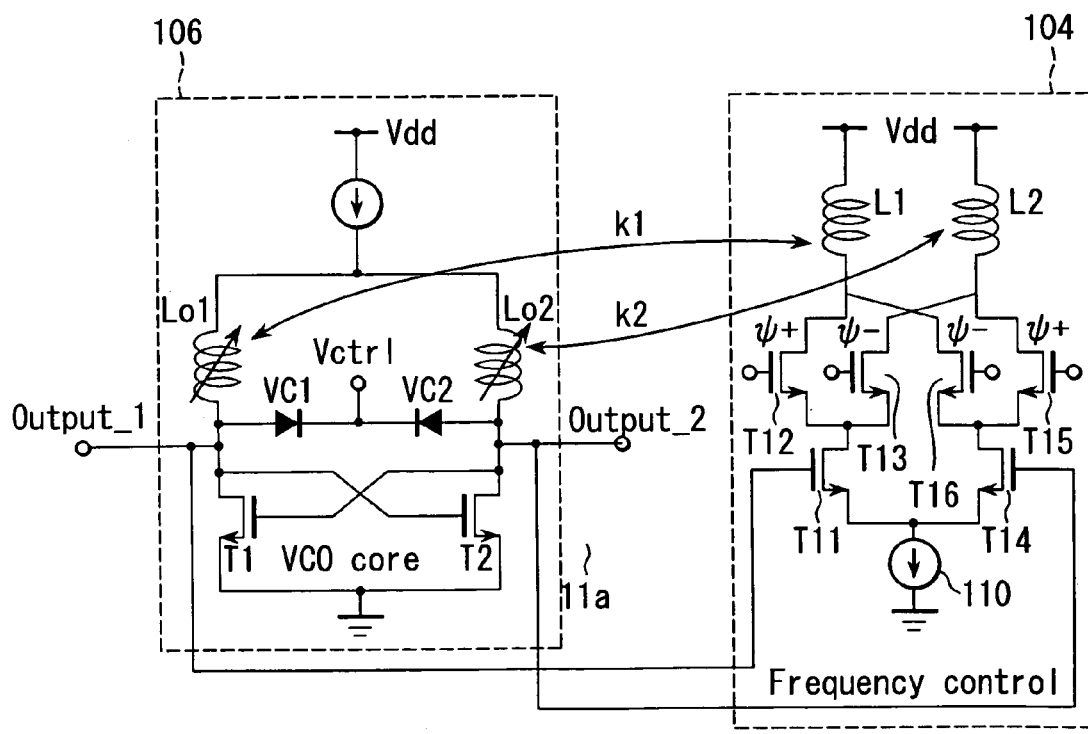
FIG. 13 is a block diagram schematically showing a circuit where a voltage-current conversion circuit of FIG. 12 is constituted of cascode-connected transistors.

FIG. 13 shows a specific example where the voltage-current conversion circuit 108 is constituted of cascode-connected transistors. A voltage control oscillation circuit 16 of a differential LC resonant type is similar to the circuitry shown in FIG. 12, and denoted by the same reference numeral in FIG. 13, and thus description thereof will be omitted. Hereinafter, a frequency control section 104 will be described.

A drain of a transistor T12 is connected to the inductor L1, and a source of the transistor T12 is connected to a drain of a transistor T11 to which gate an output (Output_1) is input. A source of the transistor T12 is grounded through a current source 110. A source of a transistor T13 which drain is connected to the inductor L2 is connected to the drain of the transistor T11. A control signal φ+ is input to a gate of the transistor T12, and a control signal φ− is input to a gate of the transistor T13. That is, the inductor L1 is connected to the transistor T12 cascode-connected to the transistor T11 where the source is grounded through the current source and the output 1 (Output_1) is supplied to the gate, and the control signal φ+ is supplied to the gate of the transistor T12. The inductor L2 is connected to the transistor T13 cascode-connected to the transistor T11, and the control signal φ− is supplied to the gate of the transistor T13.

Similarly, a drain of a transistor T15 is connected to the inductor L2, and a source of the transistor T15 is connected to a drain of a transistor T14 to which gate an output (Output_2) is input. A source of the transistor T14 is grounded through a current source. A source of a transistor T16 which drain is connected to the inductor L1 is connected to the drain of the transistor T14. A control signal φ+ is input to a gate of the transistor T15, and a control signal φ− is input to the transistor T16. That is, the inductor L2 is connected to the transistor T15 cascode-connected to the transistor T14 where the source is grounded through the current source and the output 2 (Output_2) is supplied to the gate, and the control signal φ+ is supplied to the gate of the transistor T15. The inductor L1 is connected to the transistor T16 cascode-connected to the transistor T14, and the control signal φ− is supplied to the gate of the transistor T16.

By changing the control signals φ+, φ−, for example, directions of currents flowing through the inductors L1, L2 can be reversed. Additionally, by properly setting potentials of the control signals φ+, φ−, amplitudes of the currents flowing through the inductors L1, L2 can be changed.

Thus, by controlling the control signals φ+, φ−, the currents flowing through the inductors L1, L2 are controlled and, as a result, it is possible to control inductance values of the inductors L01, L02 coupled to the inductors L1, L2. For example, when a current flowing through the inductor L01

(L02) and a current flowing through the inductor L1 (L2) are in-phase, an inductance value of the inductor L01 (L02) becomes large and, as a result, an oscillation frequency becomes low. When a current flowing through the inductor L01 (L02) and a current flowing through the inductor L1 (L2) are reverse in phase, an inductance value of the inductor L01 (L02) becomes small and, as a result, an oscillation frequency becomes high.

Figure 14:
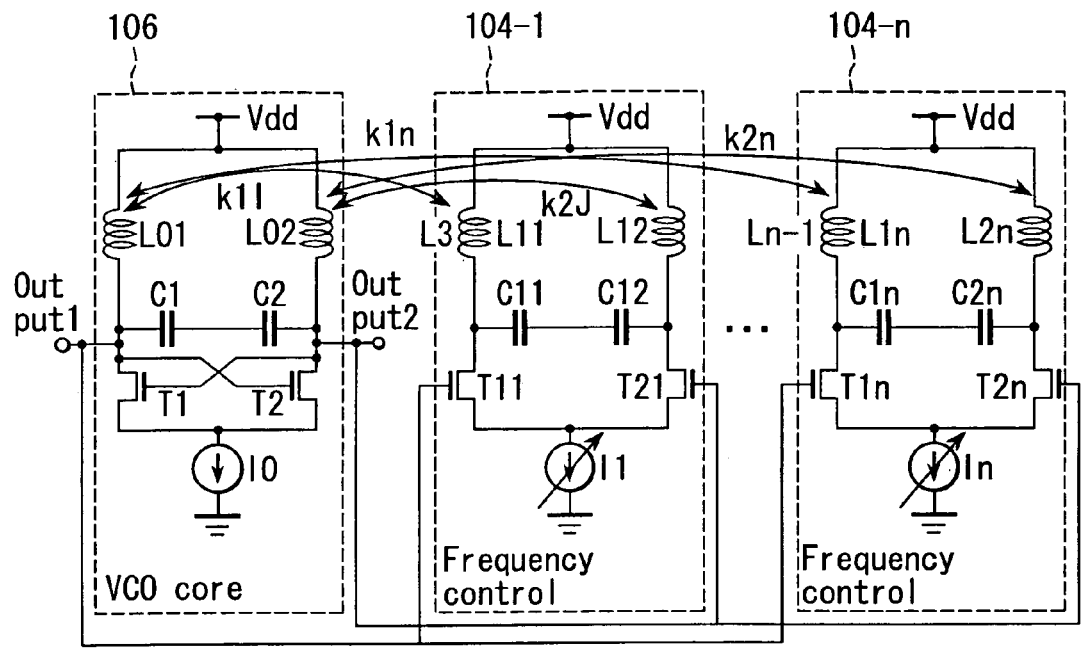
FIG. 14 is a block diagram schematically showing an oscillator according to a yet another embodiment of the present invention where a plurality of differential pairs are arranged.

FIG. 14 shows an oscillator of an embodiment where a plurality of differential pairs are arranged.

One end of an inductor L01 is connected to a current source having a power supply voltage Vdd, and the other end is connected to a drain of a MOS transistor T1 and a capacitor Cl. A source of this MOS transistor T1 is grounded through a current source I0.

Similarly, one end of an inductor L02 is connected to a current source having a power supply voltage Vdd, and the other end is connected to a drain of a MOS transistor T2 and a capacitor C2 constituted of a drain. A source of this transistor T2 is grounded through the current source I0.

The drain of the transistor T1 is connected to a gate of the transistor T2 and, similarly, the drain of the transistor T2 is connected to a gate of the transistor T1.

In the circuit shown in FIG. 14, capacitances of the capacitors C1, C2 are fixed. However, variable capacitors may be used as in the case shown in FIG. 12.

In the circuit shown in FIG. 14, an oscillation frequency control section is constituted of a plurality of differential pairs. An inductor L1n one end of which is connected to the power supply voltage Vdd, e.g., an inductor L11, is electro-magnetically connected to an inductor L01 of a VCO circuit 106 based on a coupling coefficient kin, e.g., a coupling coefficient k11, and the other end is connected to a MOS transistor T1n, e.g., a drain of a transistor T11. A capacitor C1(n), e.g., a capacitor C11, is branched to be connected between a drain of the transistor T1n and the inductor L1n. An output 1 (Output_1) of the VCO circuit is supplied to a gate of the transistor T1n, and a source of the transistor T1n is grounded through a variable current source In, e.g., a variable current source I1.

Similarly, an inductor L2n one end of which is connected to the power supply voltage Vdd, e.g., an inductor L21, is electro-magnetically coupled to an inductor L02 of the VCO circuit based on a coupling coefficient k2n, e.g., a coupling coefficient k21, and the other end is connected to a MOS transistor T2n, e.g., a drain of a transistor T21. A capacitor C2(n), e.g., a capacitor C21, is branched to be connected between a drain of the transistor T2n and the inductor L2n.

An output 2 (Output_2) of the VCO circuit 106 is supplied to a gate of the transistor T2n, and a source of the transistor T2n is grounded through the variable current source In.

For the capacitor C1n and the capacitor C2n, e.g., the capacitor C11 and the capacitor C21, the other ends connected to the inductors are interconnected.

A plurality of such differential pairs are prepared, and current values of variable current sources I0 to In are changed or turned ON/OFF to change inductance of the inductors L01, L02 of the VCO circuit 106. Accordingly, it is possible to control an oscillation frequency.

Figure 15:
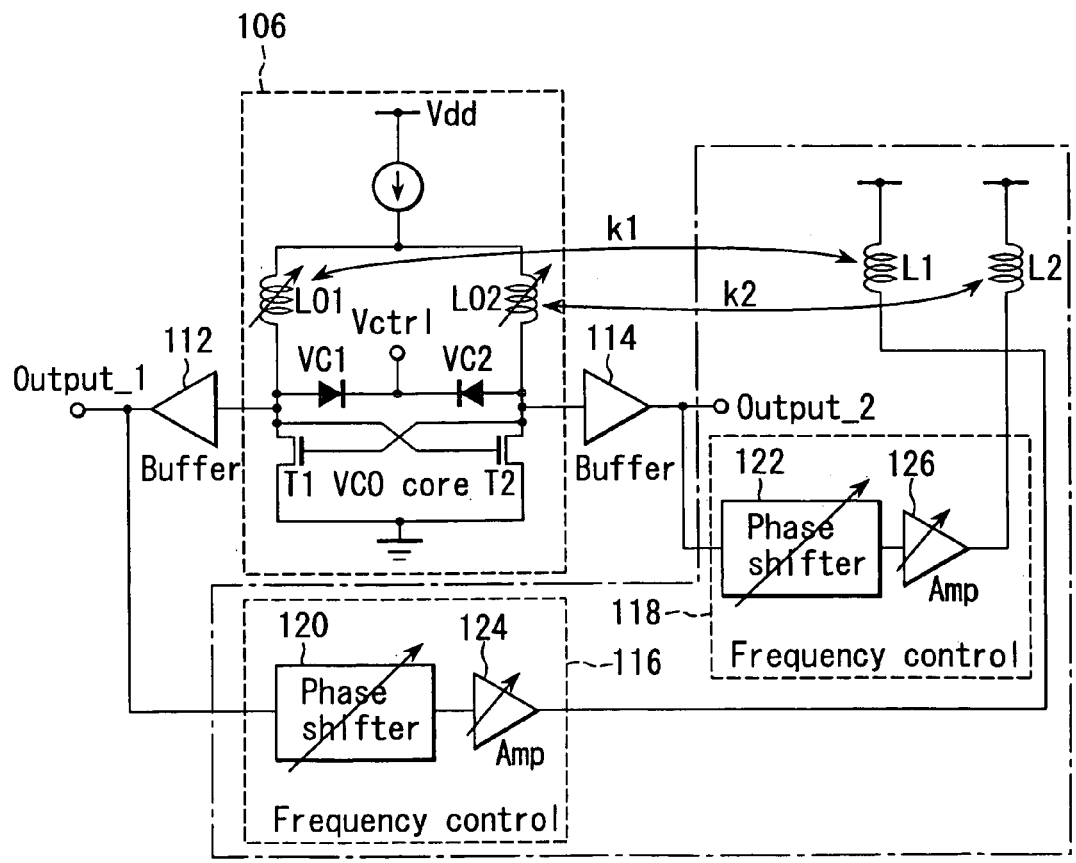
FIG. 15 is a block diagram schematically showing an oscillator according to a still another embodiment of the present invention which uses a variable phase shifter and a variable gain amplifier.

FIG. 15 shows an oscillator of an embodiment which uses a variable phase shifter and a variable gain amplifier.

A VCO circuit 106 has components similar to those shown in FIG. 12, denoted by similar reference numerals, and description thereof will be omitted. Buffer circuits 112, 113 having large impedance seen from the outside are connected to an output terminal.

Output signals (Output_1, Output_2) from the oscillator are input into variable phase shifters 116, 118 of an oscillation frequency control circuit 104. The phases of the input signals are properly controlled by variable phase shifters 120, 122 and are output from the shifters 120,122. Subsequently, a current is controlled through variable gain amplifiers 124, 126, and a current which phase/current amplitude value is controlled is supplied to an inductor L1 electromagnetically coupled to an inductor L01 based on a coupling coefficient k1.

Similarly, a current flowing through an inductor L2 coupled to an inductor L02 based on a coupling coefficient k2 is controlled.

By properly controlling the phase shifting and the current values, inductance of the inductors L01, L02 of the VCO circuit 106 can be varied, whereby an oscillation frequency can be changed and controlled.

Figure 16:
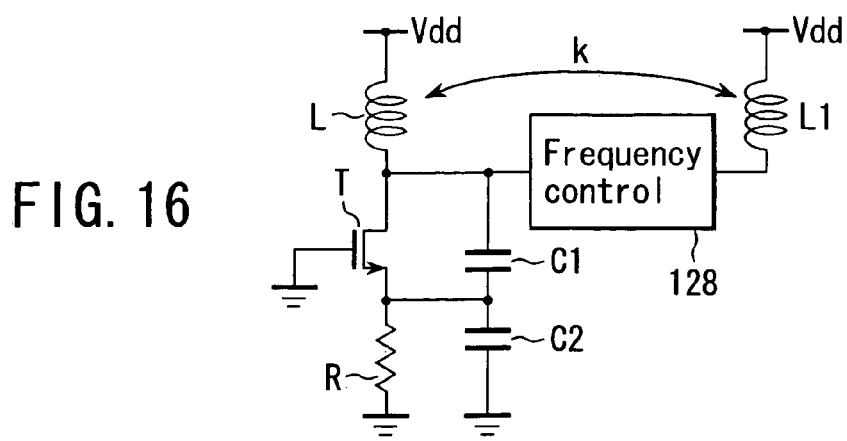
FIG. 16 is a block diagram schematically showing Colpitts oscillation circuit according to a yet another embodiment of the present invention.

The circuit example has been described by referring to the differential type. However, it can be similarly applied in the case of a single phase. Description will be made of a circuit example where a variable inductor is applied to Colpitts oscillation circuit by referring to FIG. 16.

The other end of an inductor L one end of which is connected to a power supply voltage Vdd is connected to a drain of a MOS transistor T, and a source of the transistor T is grounded through a resistor R. An inductor L0 and the transistor T are branched from a connection point, and capacitors C1, C2 are connected in series to be grounded. A source of a transistor T1 is connected to a connection point between the capacitor C1 and the capacitor C2.

An output from the connection point between the inductor L0 and the capacitor C1 is input to a frequency control section 128 (frequency control), and connected to the power supply voltage Vdd to control a current flowing through an inductor L1 electro-magnetically coupled to the inductor L0 based on a coupling coefficient k. Accordingly, it is possible to change and control an oscillation frequency.

The embodiment has been described based on the use of the MOS transistor. Needless to say, however, a circuit having a similar function can also be realized by a bipolar transistor or the like.

Figure 17:
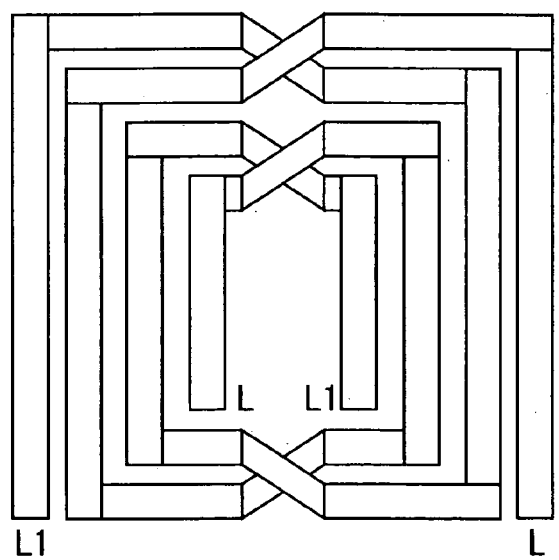
FIG. 17 is a plan view schematically showing a layout pattern of the inductor.

The inductor constituting the aforementioned oscillator of the inductor variable type, i.e., the inductor L1 electro-magnetically coupled to the inductor L0 of the LC resonant circuit side based on the coupling coefficient k, can be realized by various constitutions. For example, as shown in FIG. 17, a constitution can be employed where a spiral conductor constituting the inductor L and a spiral conductor constituting the inductor L1 are arrange to be symmetrical. In this case, the conductors intersect each other at a center of FIG. 17, and this intersection portion is constituted so as to overlap the conductors through an insulating film. Accordingly, portions other than the intersection area can be realized by one wiring layer.

Figure 18:
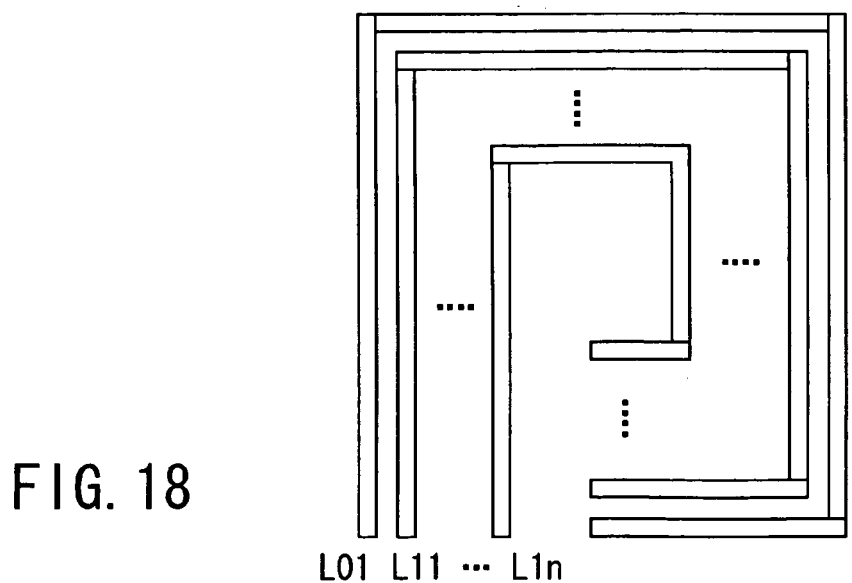
FIG. 18 is a plan view schematically showing another layout pattern of the inductor.

When a plurality of inductors L11 . . . L1n electro-magnetically coupled to the inductor L01 as shown in FIG. 18, a constitution can be employed where the inductors L11 . . . L1b of one turn are arranged in an inner peripheral side of the inductor L01 of one turn.

Figure 19:
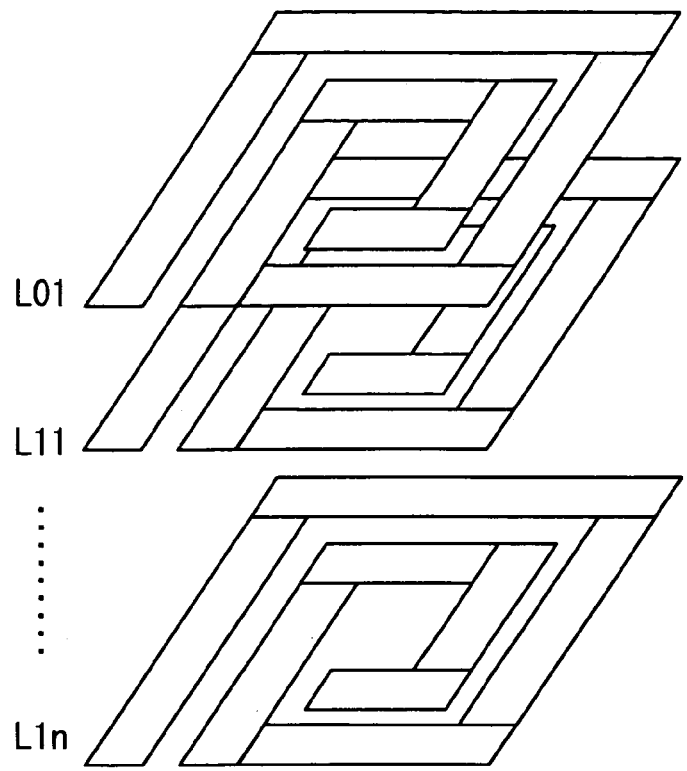
FIG. 19 is a plan view schematically showing yet another layout pattern of the inductor. Schematic view of the inductor explaining the embodiment of the present invention.

It is not necessary to arrange conductor patterns on the same plane. For example, as shown in FIG. 19, a multilayer wiring can be used to laminate the inductors L01, L11 . . . L1n. In FIG. 19, there is an insulating layer between coil conductors which constitute the inductors L01, L11 . . . L1n. However, in FIG. 19, the insulating layer is omitted to simplify the drawing.

Figure 20:
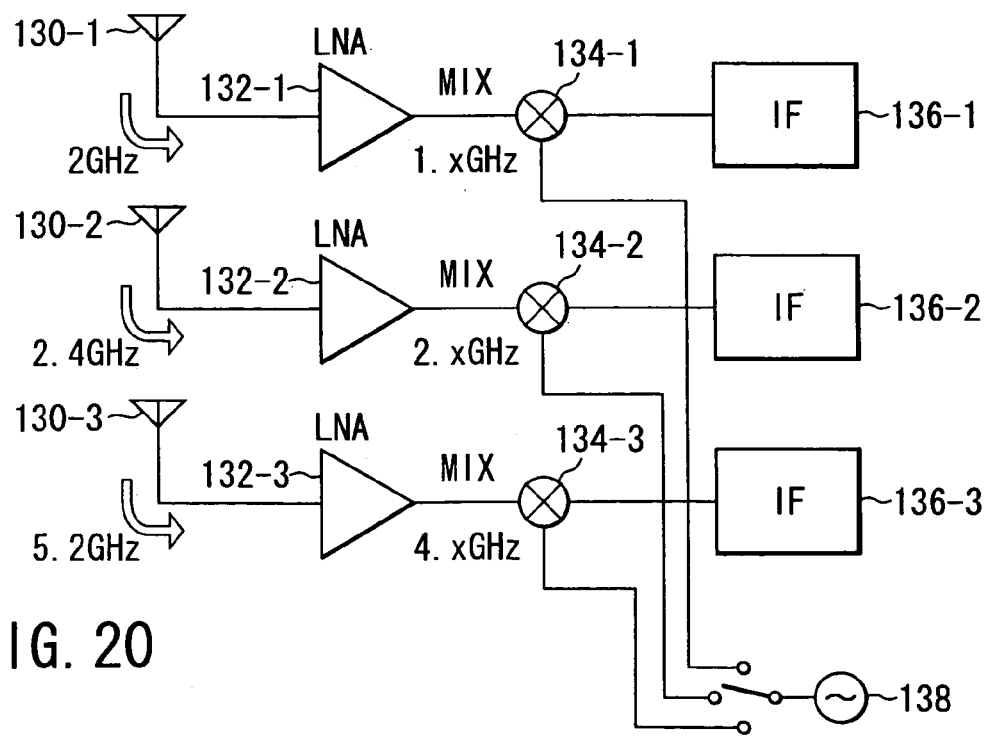
FIG. 20 is a block diagram schematically showing a radio terminal which comprises the oscillator shown in each of FIGS. 11 to 16.

Thus, by using the oscillator of a wide variable frequency range, it is possible to miniaturize the radio terminal which is suited to a plurality of communication systems having different frequencies. That is, in the conventional radio terminal, in order to supply an oscillation frequency corresponding to each communication system, an oscillator corresponding to each oscillation frequency must be mounted. However, according to the oscillator of the embodiment of the present invention, since the variable frequency range is wide, the communication systems which use various oscillation frequencies can be deal with by one oscillator. FIG. 20 shows a block of a radio terminal which supports various communication systems which use communication frequencies of 2 GHz, 2.4 GHz, 5 GHz. Signals of the communication systems are supplied to intermediate frequency sections (IF) 136-1, 136-2, 136-3 through antennas 130-1, 130-2, 130-3, low noise amplifiers 132-1, 132-2, 132-3, and mixers (MIX) 134-1, 134-2, 134-3. Outputs from the intermediate frequency sections (IF) 136-1, 136-2, 136-3 are supplied to a base band processing section. Signals of oscillation frequencies corresponding to communication systems are supplied to the mixers (MIX) 134-1, 134-2, 134-3. In this circuit example, oscillation frequencies of 1. xGHz, 2. xGH, 4. xGHz are supplied from the oscillator 138. For the oscillator 138 which supplies the oscillation frequencies, the oscillator of the aforementioned embodiment of the present invention is used. A signal of a desired frequency obtained by changing inductance is switched by a switch to be supplied to the mixer MIX of each communication system.

As described above, according to the radio terminal of the embodiment of the present invention, without disposing a plurality of oscillators, a plurality of communication systems having different frequency bands, e.g., a potable telephone (PDC, W-CDMA), a Bluetooth®, a radio LAN (2.4 GHz, 5 GHz) etc., can be supported by one radio terminal. According to the oscillator of the embodiment of the invention, a wide variable frequency range can be realized and, as a result, oscillation frequencies can be supplied to the plurality of communication systems by one oscillator.

<Amplifier Comprising Variable Inductor and Radio Terminal Having this Amplifier>

Next, description will be made of an amplifier which comprises the variable inductor of the embodiment of the present invention.

Figure 21:
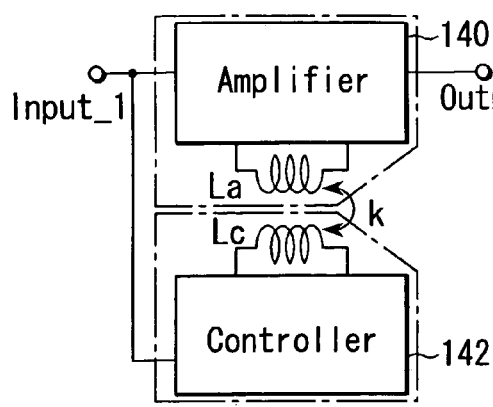
FIG. 21 is a block diagram schematically showing an amplifier according to an embodiment of the present invention.

FIG. 21 is a block diagram schematically showing an amplifier according to an embodiment of the present invention.

The amplifier shown in FIG. 21 comprises an amplifier circuit 140 which includes an inductor La for degeneration, and a control section 142 which comprises an inductor Lc electro-magnetically coupled to the inductor L based on a coupling coefficient k.

The control section 142 receives an input signal Input_1 to the amplifier circuit 140, and supplies a signal current to the inductor Lc. An output Output_1 of the amplifier is changed in characteristics in accordance with an inductance value of the inductor La changed by the signal current supplied to the inductor Lc.

In the circuit shown in FIG. 21, only one inductor Lc is shown. However, the number is not limited to one, and a plurality of inductors Lc-1 to Lc-n may be disposed. If the plurality of inductors Lc-1 to Lc-n are disposed, various controls can be realized. For example, an arrangement can be made where inductors Lc-n having equal coupling coefficients and equal flowing currents are prepared, these currents are turned ON/OFF to change the number of inductors Lc-1 to Lc-n through which the currents flow, and thereby the activated inductors Lc-n electro-magnetically coupled to the inductor L are changed.

Additionally, inductors Lc-1 to Lc-n having different coupling coefficients k1 to kn are prepared to be used switchingly. Further, more meticulous control can be carried out by changing currents which flow through the inductors Lc-1 to Lc-n.

Inductance of the inductor La can be seemingly changed by changing a phase as in the case of control of the amount of a current including ON/OFF control.

For simpler control, a system may be employed where one inductor Lc is prepared, and a current flowing through this inductor is subjected to binary control of ON/OFF. In this control system, satisfactory effects of amplification characteristic varying can be exhibited.

A specific example of a differential amplifier will be described by referring to FIG. 22.

Figure 22:
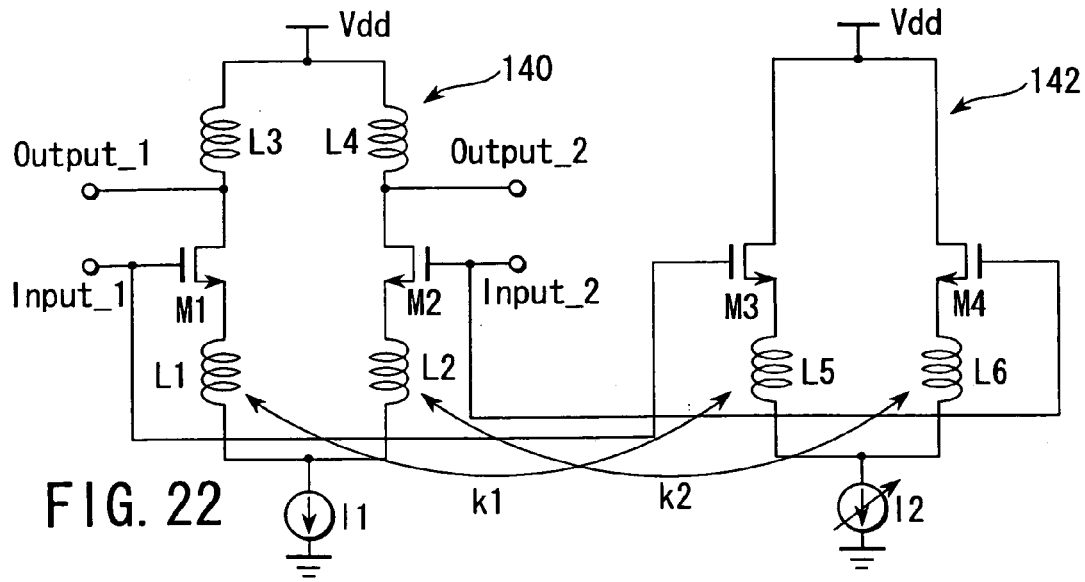
FIG. 22 is a circuit diagram showing a specific circuit of the differential amplifier shown in FIG. 21.

As shown in FIG. 22, a source of a MOS transistor M1 to which gate an input signal Input_1 is input is connected through a degeneration inductor L1 to a current source I1. The other end of this current source I1 is grounded. An inductor 13 is connected to a drain of the MOS transistor M1, and the other end of the inductor L3 is connected to a power supply potential Vdd.

An input signal Input_2 is input to a gate of a MOS transistor M2 which constitutes a differential pair. As in the case of connections of the inductor L1, the MOS transistor M1 and the inductor L3, a degeneration inductor L2 is connected to a source of the MOS transistor M2, and inductor L4 is connected to a drain. The inductor L2 is connected to the current source I1, and the inductor L4 is connected to power supply potential Vdd.

Output signals Output_1, Output_2 are outputted from the drains of the MOS transistors M1, M2. The control section comprises MOS transistors M3 and M4 to which gates input signals Input_1, Input_2 of the differential amplifier are input. An inductor L5 connected to the inductor L12 based on a coupling coefficient k1 is connected to a source of the MOS transistor M3, and grounded through the variable current source I2. Similarly, a source of the MOS transistor M4 is connected to the variable current source I2 through an inductor L6 coupled to the inductor L2 based on a coupling coefficient k2. Drains of the MOS transistors M3, M4 are connected to the power supply potential Vdd.

In order to change characteristics of an output signal from the differential amplifier, e.g., distortion characteristics or the like, a current value of the variable current source I2 is changed. It is assumed that a current change of the variable current source I2 is a binary of a current ON/OFF. When the variable current source I2 is ON, it is assumed that a pair of electro-magnetically coupled inductors L1, L5 and a pair of electro-magnetically coupled inductors L2, L6 are arranged in magnetic field weakening directions. In such a circuit, when the variable current source I2 is ON, inductance of the degeneration inductor looks small, and thus low noise can be achieved by a high gain. That is, a high-gain/low-noise mode can be set. When the variable current source I2 is OFF, since no magnetic fields are generated to cancel magnetic fields generated in the inductors L1, L2, compared with the case where the variable current source I2 is ON, degeneration inductance looks large. In this case, good distortion characteristics can be obtained. That is, a mode which attaches importance to distortion characteristics can be set.

Therefore, when a differential amplifier is constituted, it is only necessary to design a degeneration inductor so that it can have relatively large inductance.

In the foregoing, the current value of the variable current source 2 is controlled by a binary of ON/OFF. However, desired amplifier characteristics can be obtained by the current value in steps or continuously.

Figure 23:
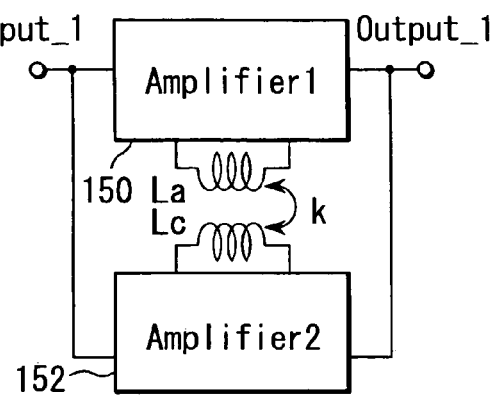
FIG. 23 is a block diagram showing an amplifier according to an another embodiment of the present invention.

FIG. 23 is a block diagram schematically showing a differential amplifier according to another embodiment of the present invention.

The amplifier shown in FIG. 23 comprises a first amplifier circuit 150 which includes a degeneration inductor La, and a second amplifier 152 which includes an inductor Lc electro-magnetically coupled to the inductor La based on a coupling coefficient k.

The second amplifier 152 to which the same input signal Input_1 as that of the first amplifier 150 is entered functions as a control section to control amplifier characteristics of the first amplifier 150, e.g., distortion characteristics or the like. An output of the second amplifier 152 is added to an output of the first amplifier 150 to be outputted as an output signal Output_1.

As in the case of the aforementioned embodiment, the second amplifier 152 equivalent to the control section receives an input signal Input_1 to the amplifier circuit 150, and supplies a signal current to the inductor Lc. The output Output_1 of the first amplifier 150 is changed in characteristics in accordance with an inductance value of the inductor L changed by the signal current supplied to the inductor Lc. At this time, the output of the second amplifier 152 is returned to the output Output_1 so that an amplification rate is increased with respect to the input signal Input_1.

Figure 24:
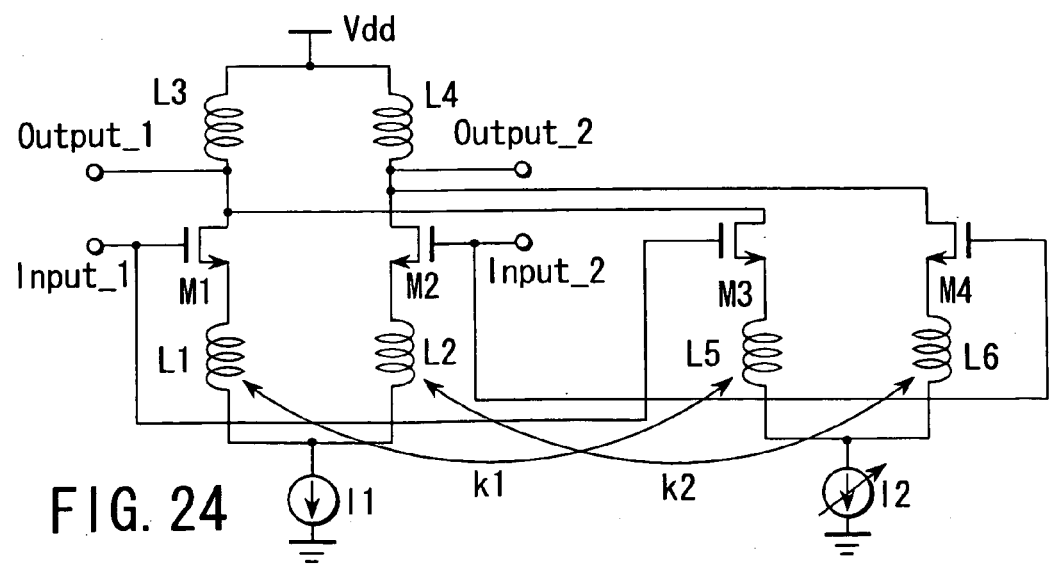
FIG. 24 is a circuit diagram showing a specific circuit of the differential amplifier shown in FIG. 23.

FIG. 24 shows a specific circuit example of the differential amplifier shown in FIG. 23.

A source of a MOS transistor M1 to which gate an input signal Input_1 is connected to a current source I1 through a degeneration inductor L1. The other end of the current source I1 is grounded. An inductor L3 is connected to a drain of the MOS transistor M1, and the other end of the inductor L3 is connected to a power supply potential Vdd.

An input signal Input_2 is input to a gate of the MOS transistor M2 which constitutes a differential pair. As in the case of connections of the inductor L1, the transistor M1 and the inductor L3, a degeneration inductor L2 is connected to a source of the MOS transistor M2, an inductor L4 is connected to a drain thereof, the inductor L2 is connected to the current source I1, and the inductor L4 is connected to the power supply potential Vdd.

Output signals Output_1, Output_2 are outputted from the drains of the MOS transistors M1, M2. The second amplifier 152 equivalent to the control section comprises a MOS transistor M3 and a MOS transistor M4 to which gates the input signals Input_1, Input_2 of the differential amplifier are input.

An inductor L5 coupled to the inductor L1 based on a coupling coefficient k1 is connected to a source of the MOS transistor M3, and grounded through a variable current source I2. Similarly, a source of the MOS transistor M4 is connected to the variable current source I2 through an inductor L6 coupled to the inductor L2 based on a coupling coefficient k2.

A drain of the MOS transistor M3 is connected to the drain of the MOS transistor M1, and a current from the variable current source I2 which flows through the MOS transistor M3 is added to the output signal Output_1. Similarly, a drain of the MOS transistor M4 is connected to the drain of the MOS transistor M2, and a current from the variable current source I2 which flows through the MOS transistor M4 is added to the output signal Output_2.

By employing such circuitry, the current flowing through the control section can be used to increase current utilization efficiency for the amplifier as a whole.

Though depending on designs, for example, if a current flowing through a normal amplifier is 5 mA, it may be necessary to supply a current up to 10 mA in order to realize low distortion characteristics. On the other hand, in the circuit shown in FIG. 24, I1=I2=2.5 mA is set when high-gain/low noise is achieved, characteristics similar to those when a current of 5 mA is supplied in the normal amplifier can be expected. On the other hand, when low distortion characteristics are achieved, only by turning OFF the current source I2 to supply a current of 2.5 mA to the current source I1, it is possible to realize low distortion characteristics by a large degeneration inductor effect.

In the aforementioned circuit, amplifier characteristics can be varied, which is accompanied by a change in input impedance of the amplifier. Generally, the input impedance change of the amplifier is not desirable. Thus, an impedance control section is preferably disposed in the input section of the amplifier.

By referring to FIG. 25, description will be made of a circuit which comprises a variable resistor as an input impedance control section.

In the circuit shown in FIG. 25, a variable resistor Rv is inserted between an input terminal Input_1 and an input terminal Input_2. The circuit shown in FIG. 25 has other components excluding the variable resistor Rv which are similar to those of FIG. 24.

The variable resistor Rv may be constituted by using an FET as shown in FIG. 26A, or by combining a fixed resistor with a switch as shown in FIG. 26B.

In the circuit shown in FIG. 25, as shown in FIG. 27, input impedance of an amplification stage is represented by the following equation (5):

$$Zin = Lgm/C + j(\omega L - 1/\omega C) \quad (5)$$

In the equation (5), if a bias current flows, there is a real part defined by a first item of the equation (5). However, if the bias current is OFF, gm=0 is set, and thus the input impedance has no real parts. Therefore, in order to approximate the input impedance when the bias current is turned OFF to the input impedance when the bias current flows, a real part of the impedance must be compensated for.

To simplify explanation, a resistance value of the variable resistor Rv is set to be binary, i.e., Open/ON. In the circuit shown in FIG. 25, it is assumed that the inductor L1 and the inductor L5, and the inductor L2 and the inductor L6 are arranged in magnetic flux canceling directions. In the assumption, if the current source I1 and the current source I2 are both ON, total degeneration inductance becomes small to allow an operation by a high gain/low noise. Here, the variable resistor Rv is assumed to be open. On the other hand, if only the current source I1 is turned ON while the current source I2 is turned OFF, total degeneration inductance becomes large to allow an operation by low distortion. However, since no bias currents follow through the transistor M3 and the transistor M4, the real part of the impedance disappears. In order to compensate for the real part of the impedance, a resistance value of the variable Rv is turned ON to set a proper resistance value in the variable resistor Rv, whereby it is possible to realize input impedance close to that when an operation is carried out on a high-gain/low-noise mode.

If current control by the variable current source I2 is carried out in steps or continuously in a binary or more values, the resistance value of the variable resistor Rv may also be controlled in step or continuous changes. In such a case, it is only necessary to change a voltage φ applied to the gate by a type which uses an FET similar to that shown in FIG. 26A.

FIG. 28 shows circuitry where a gain can be varied even at a common gate circuit of a rear stage in the circuit shown in FIG. 25.

Common gate MOS transistors M11a, M11b are disposed between the MOS transistor M1 and the inductor L3 of FIG. 24, the transistor M11a is turned ON/OFF by a gate signal φ2, and a gate of the transistor M11b is connected to, e.g., a power source, to be always ON.

A MOS transistor M12 is arranged so that the drain of the MOS transistor M1 can bypass the inductor L3 and the MOS transistor M11a to be connected to a power supply potential Vdd. This MOS transistor M12 is driven by a gate signal φ1.

Similarly, MOS transistors M21a, M21b are disposed between the MOS transistor M2 and the inductor L4, the transistor M21a is turned ON/OFF by a gate signal φ2, and the transistor M21b is always ON. A MOS transistor M22 is arranged so that the drain of the MOS transistor M2 can bypass the inductor L4 and the MOS transistor M21 to be connected to the power supply potential Vdd. This MOS transistor M22 is driven by a gate signal φ1.

It is assumed that the transistors M11a, M12 and the transistors M21, M22 are constituted of MOS transistors of equal sizes, and the transistor M11b and the transistor M21b are constituted of MOS transistors of small sizes. When the gate signal φ1 is turned OFF and the gate signal φ2 is turned ON, signals supplied through the transistor M11a, the transistor M11b, the transistor M21a, the transistor M21b are outputted. On the other hand, when the gate signal φ1 is turned ON and the gate signal φ2 is turned OFF, only a signal supplied through the transistor M11b, the transistor M21b is outputted, and the other signal is discarded through the transistor M12, the transistor M22. Consequently, a gain is reduced. By using a gain switching operation and the gain switching to change the degeneration inductor at the same time, it is possible to realize a larger gain switching width.

Figure 29:
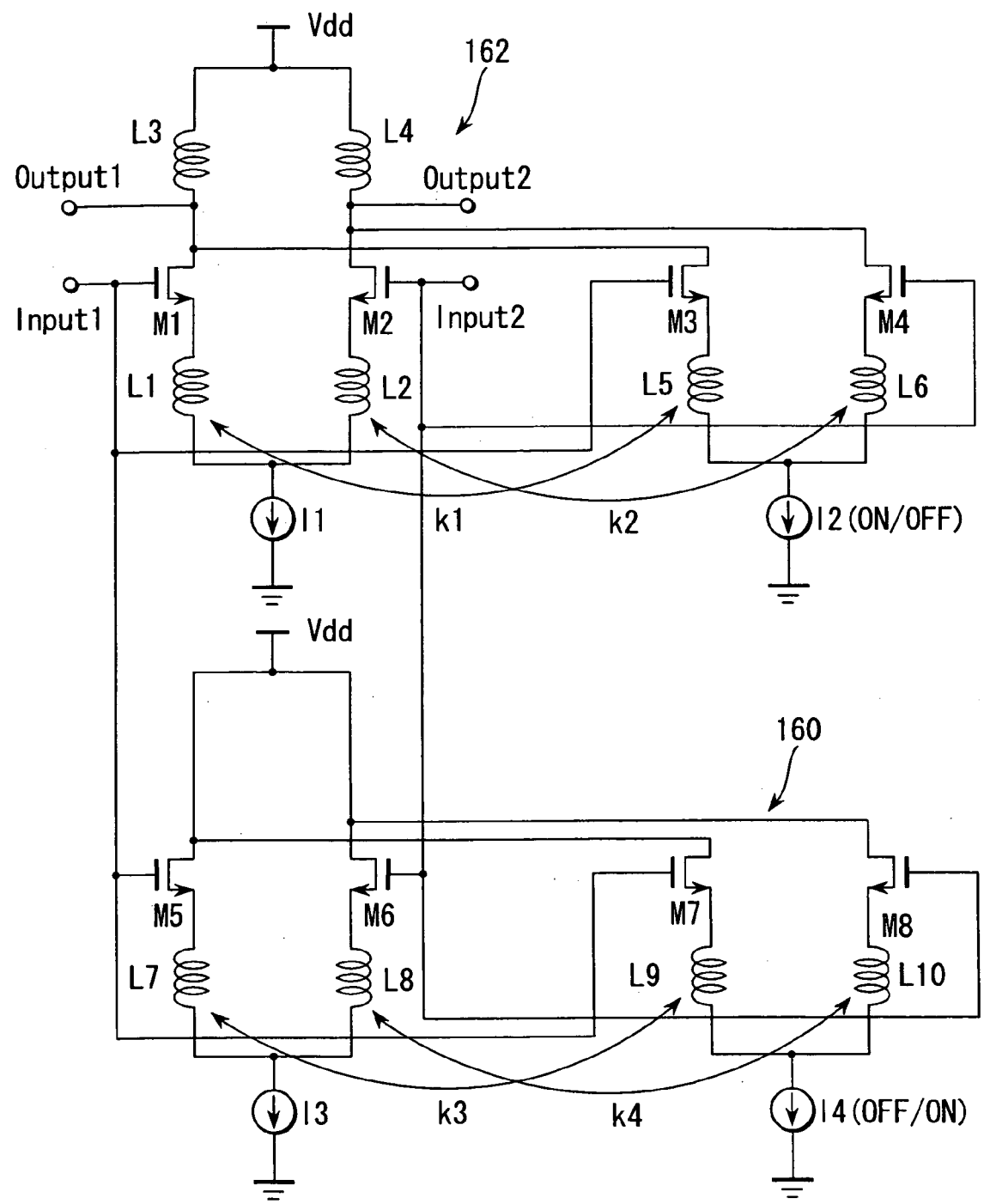
FIG. 29 is a circuit diagram showing yet another specific circuit example of the differential amplifier shown in FIG. 21.

FIG. 29 shows a circuit example where an inductance variable circuit is used to adjust input impedance.

In place of the variable resistor Rv shown in the circuit of FIG. 25, an impedance adjustment circuit 160 is disposed which has components similar to the transistor M2 and the inductor L1, the transistor M2 and the inductor L2, the transistor M3 and the inductor L5, and the transistor M4 and the inductor L6. That is, a drain of the MOS transistor M5 is connected to the power supply potential Vdd, a source thereof is connected to a current source I3 through an inductor L7, and an input signal Input_1 is supplied to a gate thereof.

A drain of the MOS transistor M6 which constitutes a differential pair with the MOS transistor M5 is connected to the power supply potential Vdd, a source thereof is connected to the current source I3 through an inductor L8, and an input signal Input_2 is supplied to a gate thereof.

As a circuit to control inductance of the inductors L7, L8, MOS transistors M7 and M8 are disposed, to which gates input signals Input_1, Input_2 of a differential amplifier 162 are input. An inductor L9 which has a coupling coefficient k3 with the inductor L7 is connected to a source of the MOS transistor M7, and grounded through a variable current source I4. Similarly, a source of the MOS transistor M8 is connected to the variable current source I4 through an inductor L10 which has a coupling coefficient K4 with the inductor L8. Drains of the MOS transistors M7, M8 are connected to the power supply potential Vdd.

To simplify explanation, the inductors L1 to L10 are set to equal inductance values, and coupling coefficients K1=K3=K2=K4 are set. The variable current sources I2, I4 are changed in a binary of a current ON/OFF, and the coupled inductors are coupled to mutually weaken magnetic fields.

When the variable current source I2 is turned ON, inductance values of the degeneration inductors L1 and L2 look small, and operated on a high-gain/low-noise mode. In this case, if the variable current source 14 is kept OFF, the impedance adjustment circuit is operated on a pseudo low-distortion mode, and total input impedance is set to a value where a high-gain/low-noise mode circuit and a low-distortion mode circuit are connected in parallel.

On the other hand, when the variable current source I2 is turned OFF, inductance values of the degeneration inductors L1 and L2 look large, and operated on a low-distortion mode. In this case, if the variable current source 14 is kept ON, the impedance adjustment circuit is operated on a pseudo high-gain/low-noise mode, and total input impedance is set to a value where a high-gain/low-noise mode circuit and a low-distortion mode circuit are connected in parallel. Thus, not changes occur even if the operation mode is switched.

Figure 30:
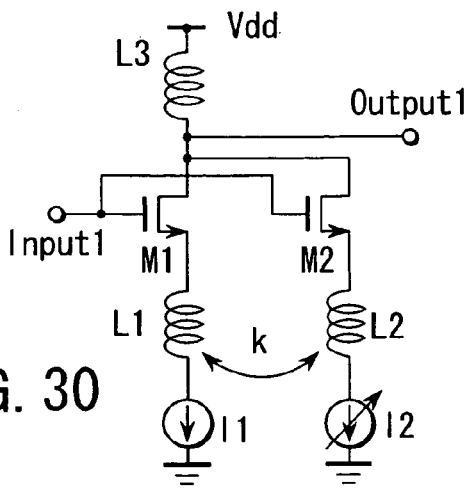
FIG. 30 is a circuit diagram showing yet another circuit of a modified example of the differential amplifier shown in FIG. 23.

Further, the embodiment has been described by way of the circuit example of the differential pair. However, similar effects can be obtained even by a single-end circuit. FIG. 30 is a circuit diagram showing an embodiment applied to a single-phase amplifier circuit.

As shown in FIG. 30, a source of a MOS transistor M1 to which gate an input signal Input_1 is input is connected to a current source I2 through a degeneration inductor L. The other end of the current source I1 is grounded. An inductor L3 is connected to a drain of the MOS transistor M1, and the other end of the inductor L3 is connected to a power supply potential Vdd. An output signal Output_1 is outputted from the drain of this MOS transistor M1.

A control section comprises a MOS transistor M2 to which gate the input signal Input_1 is input. An inductor LC having a coupling coefficient k with the inductor L is connected to a source of the MOS transistor M2, and grounded through a variable current source I2. A drain of a MOS transistor M3 is connected to the drain of the MOS transistor M1, and a current from the variable current source I2 which flows through the MOS transistor M2 is added to the output signal Output_1.

A power source of the variable current source I2 is subjected to, e.g., ON/OFF control, whereby an inductance value of the degeneration inductor L can be controlled.

A control inductor electro-magnetically coupled to the aforementioned inductor based on a coupling coefficient k, e.g., the inductors L1, L2 shown in FIG. 21, can be realized by various constitutions. For example, as shown in FIG. 17, the spiral conductor which constitutes the degeneration inductor L and the spiral conductor which constitutes the control inductor LC can be arranged to be symmetrical. In this case, the conductors intersect each other at the center in the drawing, and this portion is formed through an insulating film. Thus, portions other than the intersection area can be realized by one wiring layer. The inductor is not limited to the constitution shown in FIG. 17. Any constitution can be employed as long as the inductor can be electro-magnetically coupled, and the inductor may be constituted of the conductor pattern shown in FIG. 18 or FIG. 19.

The aforementioned circuit of the embodiment of the present invention uses the MOS transistors. Needless to say, however, active elements such as other transistors may be used.

Figure 31:
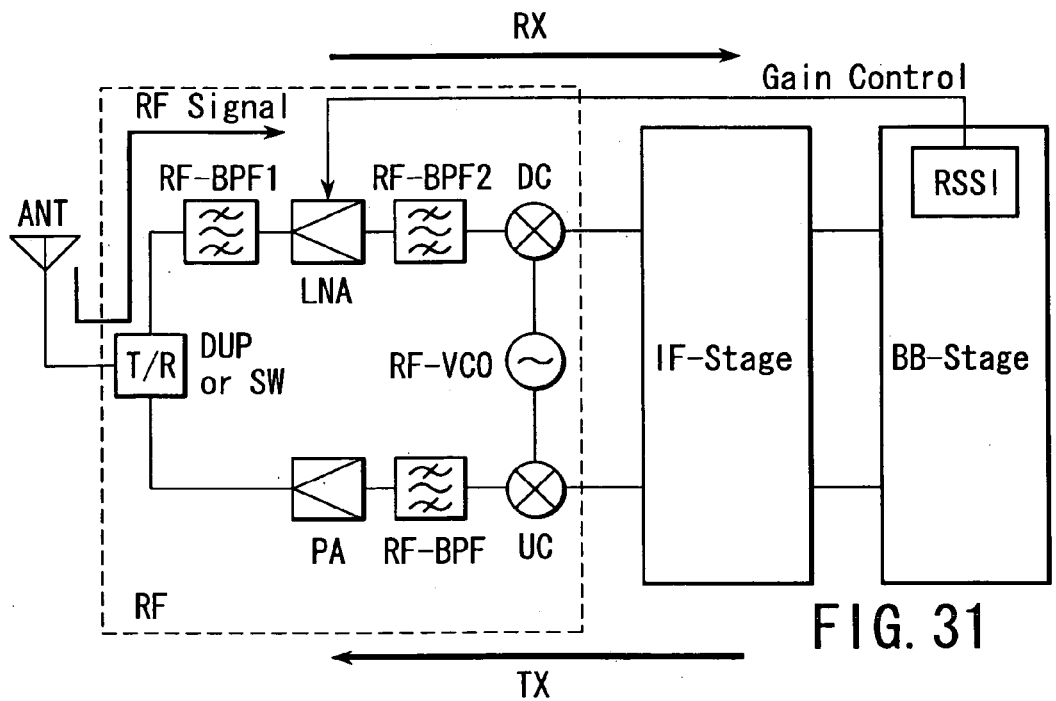
FIG. 31 is a block diagram schematically showing a radio terminal which incorporates the amplifier described above with reference to each of FIGS. 21 to 30.

The amplifier of the embodiment of the present invention can be used for a radio communication terminal such as a portable telephone. An example is shown in FIG. 31. FIG. 31 is a block diagram of a radio communication terminal.

An RF input signal from an antenna (ANT) is supplied to an RF signal processing section (RF). That is, in the RF signal processing section (RF), the signal is supplied through a switch (T/R) to an RF band-pass filter 1 (RF-BPF1), a low noise amplifier (LNA) and an RF band-pass filter 2 (RF-BPF2), multiplied by a local signal (RF-VCO) at a multiplier (DC), and frequency-converted into an intermediate frequency signal. This intermediate frequency signal is supplied to an intermediate frequency processing section (IF-Stage) and a base band signal processing section (BB-Stage).

A gain control signal (Gain Control) is supplied from a received electric field intensity determination section (RSSI) in the base band signal processing section (BB-Stage) to the low noise amplifier (LNA).

A signal to be transmitted is processed reversely to the above. That is, a signal supplied from the base band processing section (BB-Stage) and the intermediate frequency processing section (IF-Stage) is processed in the RF signal processing section (RF). In the RF signal processing section, an intermediate frequency signal is multiplied by a local signal (RF-VCO) at a multiplier (UC) to be frequency-converted. The converted signal is supplied through the RF band-pass filter (BP-BPF) to a power amplifier (PA), and supplied through the switch (T/R) to the antenna (ANT).

The aforementioned amplifier is used for the low noise amplifier (LNA) of such a radio terminal.

For the radio terminal, there are various standards. If a level of an RF signal to be input is small, amplifier characteristics of amplifying a signal by low noise may be required of the low noise amplifier (LNA). In such a case, control is carried out to reduce a degeneration inductance value of the LNA. Conversely, if an RF signal is sufficiently large, since it is important to prevent distortion of the RF signal, control is carried out to increase a degeneration inductance value of the LNA.

Such characteristic control of the low noise amplifier (LNA) can be carried out by using, e.g., a gain control signal (Gain Control). The characteristic control of the amplifier may be carried out based on a standard other than the RSSI.

Thus, by using the amplification characteristic variable amplifier of the present invention for the LNA of the RF processing section of the radio terminal, it is possible to adaptively realize desired LNA amplification characteristics without increasing current consumption.

In the amplifier described above with reference to FIGS. 20 to 30, it is assumed that at least pairs of the inductors La, Lc, L2, L5, L2, L6, L7, L9, L8, L10 are interconnected based on coupling coefficients k2, k2, k, k4, and have mutual inductance. However, the amplifier can be realized even if the pairs of inductors are not interconnected, and have no mutual inductance. The amplifier, which uses mutual inductance, is advantageous in that large degeneration can be realized and good distortion characteristics can be realized by a smaller current. On the other hand, the amplifier, which comprises the inductors having no mutual inductance, is advantages in that designing becomes easy because it is not necessary to use any inductors of complex shapes.

Hereinafter, detailed description will be made of an amplifier which comprises inductors having no mutual inductance according to another embodiment of the present invention by referring to FIGS. 31 to 38.

The description will be made by way of examples all of which use bipolar transistors. However, the amplifier can be configured by using other active elements such as an FET.

Figure 32:
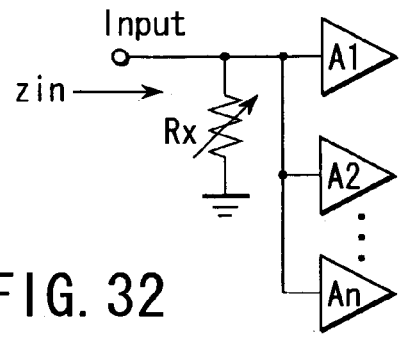
FIG. 32 is a block diagram showing basic circuitry of an amplifier which comprises an inductor having no mutual inductance according to an another embodiment of the present invention.

FIG. 32 shows basic circuitry of an amplifier according to the embodiment of the present invention. As shown in FIG. 32, a plurality of amplification stages A1 to An are connected in parallel to an input side Input and, by selectively operating the amplification stages A1 to An, a gain switching function is realized. In this circuit, the amplification stages A1 to An may have same amplification characteristics, different amplification characteristics or combinations of same amplification characteristic and different amplification characteristics, respectively. When a gain is switched, input impedance is changed. However, this change of the input impedance Zin is compensated for by a variable resistor Rx. That is, irrespective of which one of the amplification stages A1 to An is operated, a value of the variable resistor Rx is set to a proper value so as to prevent a great change in the input impedance Zin of the entire amplifier. Here, for example, it is assumed that the amplification stage A1 is set as amplification stage having a high gain and good distortion characteristics by current consumption of a certain level, and the amplification stage A2 is set as an amplification stage having a low gain and good distortion characteristics by small current consumption. If a high gain is required, the amplification stage A1 is operated. If a low gain is required, the amplification stage A2 is operated. Accordingly, a desired gain and desired distortion characteristics can be achieved, and current consumption can be limited to a minimum. By setting the variable resistor Rx to a proper value, it is possible to limit a change small in the input impedance Zin when the operations of the amplification stages A1 and A2 are switched to change the gain.

Figure 33:
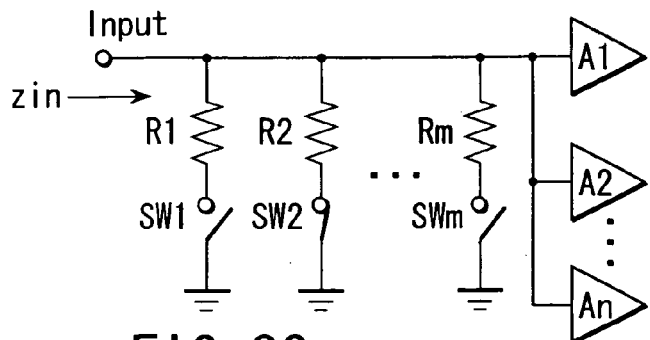
FIG. 33 is a block diagram showing a circuit to realize a variable resistor shown in FIG. 32.

FIG. 33 shows a circuit of a first embodiment to realize the variable resistor Rx of the circuit of FIG. 32. The variable resistor Rx which adjusts input impedance is realized by using fixed resistors R1 to Rm, and switches SW1 to SWm. The switches SW1 to SWm are properly switched to select the fixed resistors R1 to Rm, whereby a desired resistance value is given to the resistor Rx of the input side.

Figure 34:
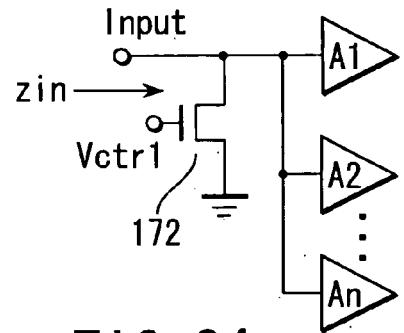
FIG. 34 is a block diagram showing a yet another circuit to realize the variable resistor shown in FIG. 32.

FIG. 34 shows a circuit of a second embodiment to realize the variable resistor Rx of the circuit of FIG. 32. The variable resistor Rx which adjusts input impedance is constituted of an FET 172. By applying a proper control voltage to a control gate Vctrl of the FET 172, a desired resistance value can be obtained.

Figure 35:
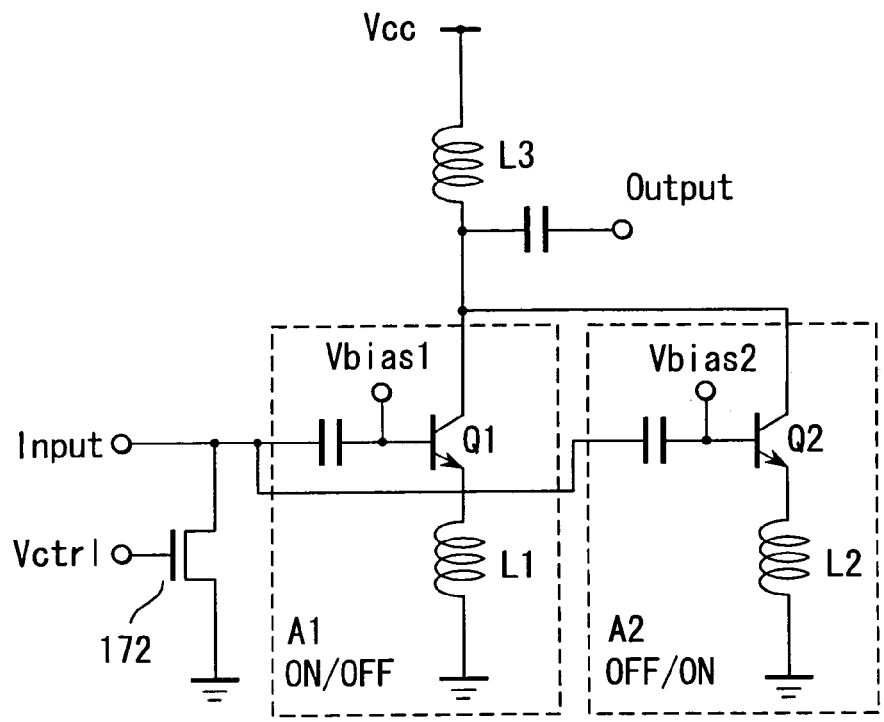
FIG. 35 is a block diagram showing a circuit to realize the variable resistor shown in FIG. 34.
Figure 36:
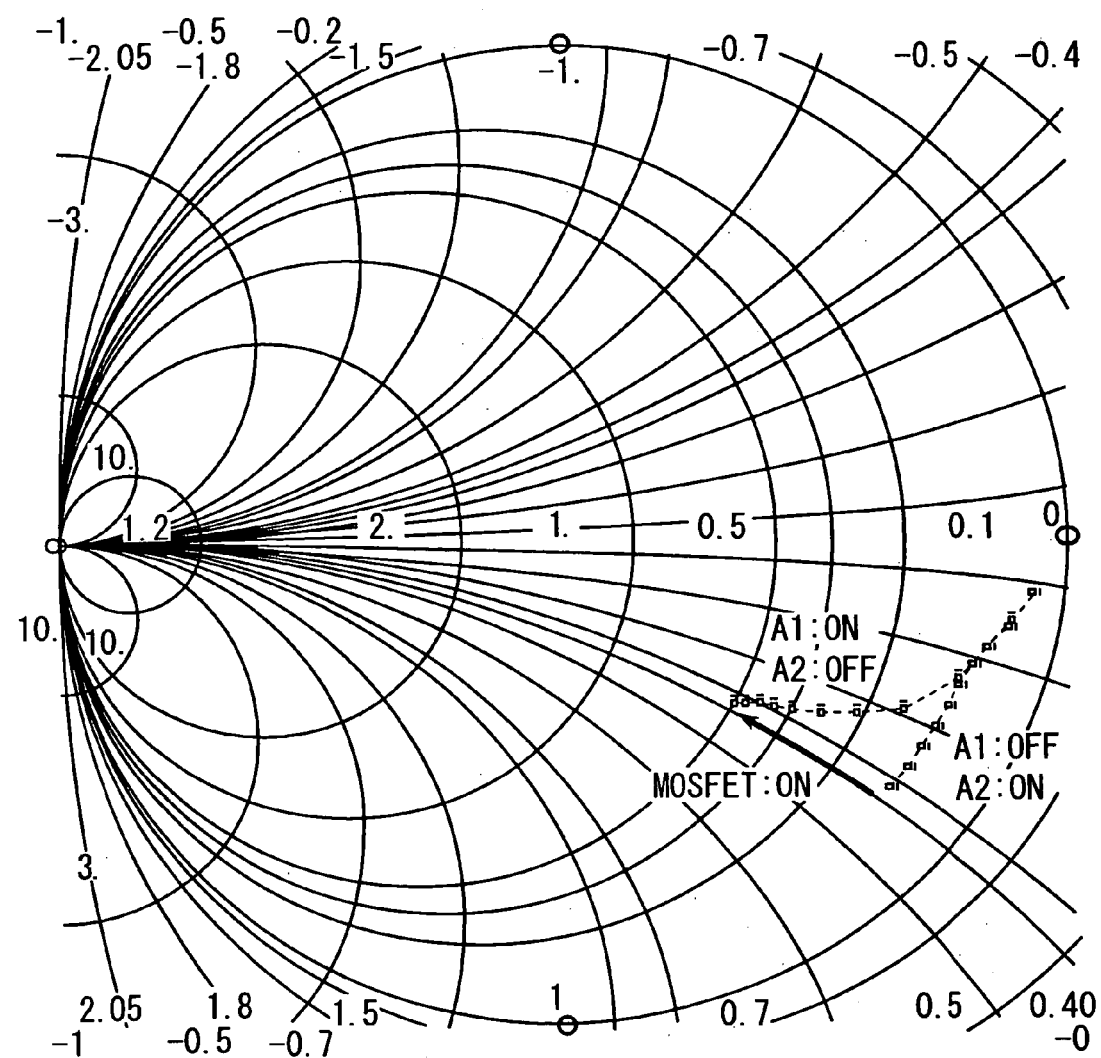
FIG. 36 is a graph showing a result of simulation of input impedance of a portion excluding a MOSFET of an input portion in the circuit shown in FIG. 35.

FIG. 35 shows a circuit of an embodiment to realize the variable resistor Rx of the circuit of FIG. 34. In the circuit shown in FIG. 35, two common emitter amplification stages A1 and A2 are connected in parallel, and a MOSFET is connected to an input stage to adjust input impedance. A degeneration inductor L1 of the amplification stage A1 has a small inductance value so as to achieve a high gain. Additionally, a degeneration inductor L2 of the amplification stage A2 has a large inductance value to achieve a low gain and good distortion characteristics. FIG. 36 shows a simulation result of input impedance (admittance) of a portion excluding the MOSFET 172 of the input section in the circuit shown in FIG. 35. FIG. 36 shows reflection coefficients on the admittance in a first case where a circuit constant and an operation point are properly set, and the amplification stage A1 is turned ON and the amplification stage A2 is turned OFF to achieve a high gain, and in a second case where the amplification stage A1 is turned OFF and the amplification stage A2 is turned ON to achieve a low gain. As apparent from FIG. 36, proper resistors are connected in parallel, i.e., the MOSFET 172 connected to the input section is turned ON, and accordingly impedance of the first and second cases shown in FIG. 36 can be set substantially equal to each other. Current consumption is about 3 mA when a high gain is achieved, and current consumption is about 1.5 mA when a low gain is achieved. In the case of the low gain, current consumption is reduced. In the case of the low gain, since a value of the degeneration inductor L2 is large while the current consumption is small, good distortion characteristics can be achieved.

Figure 37:
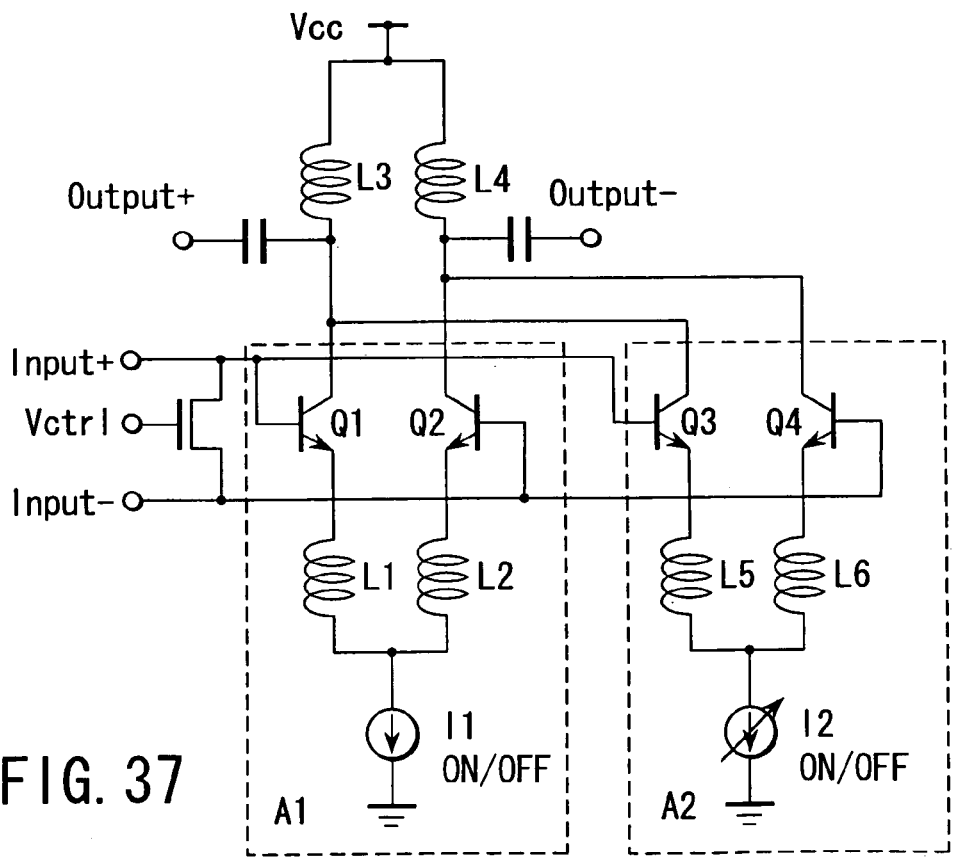
FIG. 37 is a block diagram showing a yet another circuit to realize the variable resistor shown in FIG. 34.

FIG. 37 shows a circuit of another embodiment to realize the variable resistor Rx of the circuit of FIG. 34. In the circuit shown in FIG. 37, two differential amplification stages A1 and A2 are connected in parallel, and a MOSFET 172 is connected to an input stage to adjust input impedance. Here, to achieve a high gain, the amplification stages A1, A2 are both turned ON. When the two amplifiers A1, A2 are operated, the degeneration inductor also looks small, and thus a high gain can be achieved. To achieve a low gain, only the amplification stage A1 is turned ON, and the amplification stage A2 is turned OFF. Thus, since only the inductor L1 among the degeneration inductors can be seen, degeneration becomes large, and good distortion characteristics can be achieved.

Figure 38:
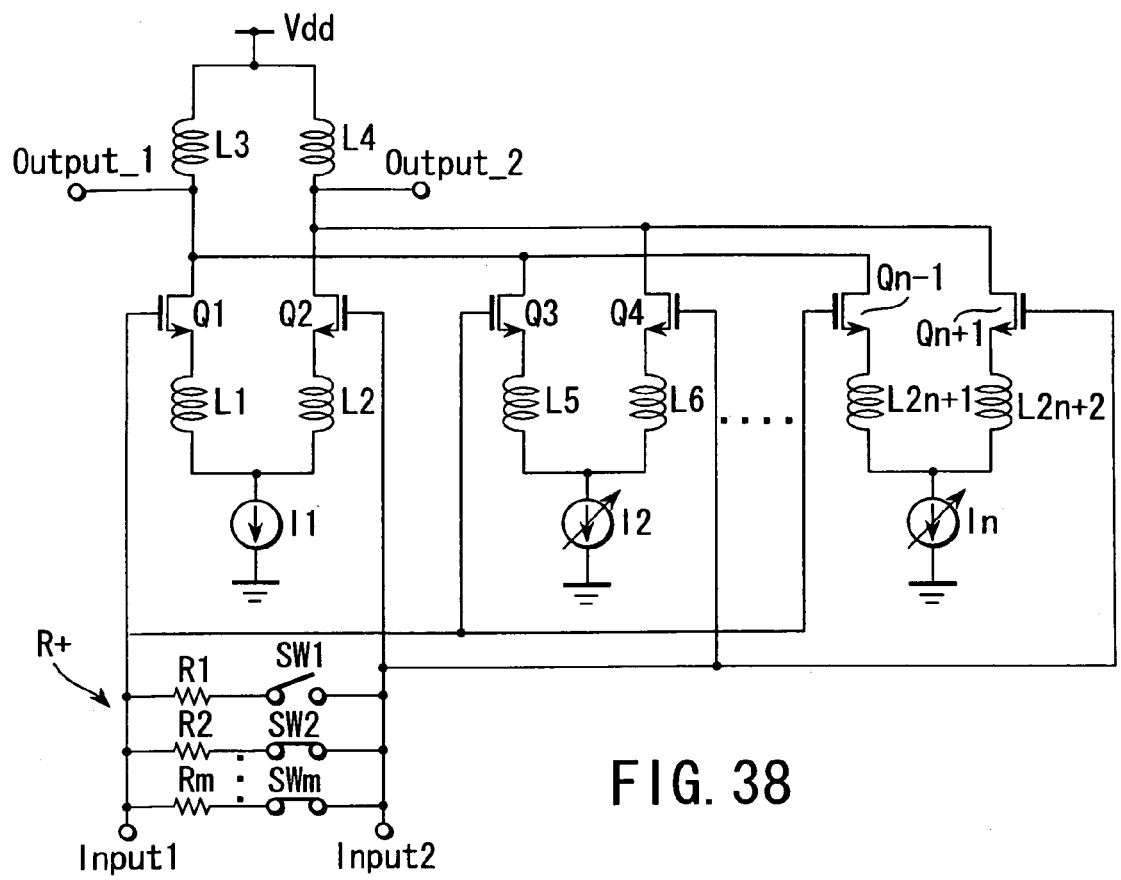
FIG. 38 is a block diagram showing a still another circuit to realize the variable resistor shown in FIG. 34.

FIG. 38 shows a circuit of an embodiment to realize the variable resistor Rx of the circuit of FIG. 33. In the circuit of FIG. 38, serial circuits of fixed resistors R1 to R3 and switches SW1 to SWm are connected in parallel between inputs Input_1, Input_2. In this circuit, by selectively switching ON/OFF the switches SW1 to SWm, the resistor Rx of an input side can be properly set. That is, by properly switching the switches SW1 to SWm, the fixed resistors R1 to Rm are selected to give a desired resistance value to the resistor Rx of the input side.

Figure 39:
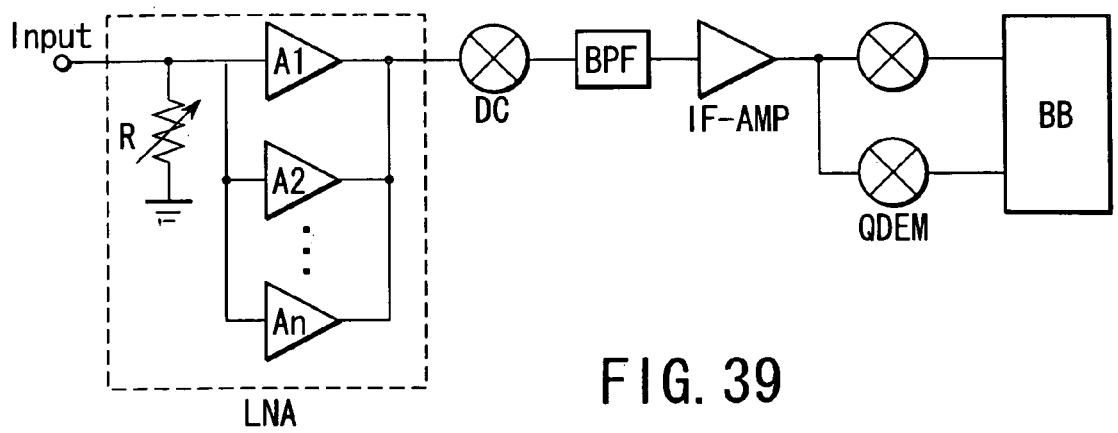
FIG. 39 is a block diagram showing a circuit example of a radio terminal where an amplifier circuit of FIG. 32 is applied to a low-noise amplifier of a radio equipment.

FIG. 39 shows a circuit example where the amplifier circuit of FIG. 32 is applied to a low nose amplifier of a radio terminal. In the circuit of the radio terminal shown in FIG. 39, an RF input signal from an antenna (ANT) is input to an RF signal processing section (RF), and supplied to the low noise amplifier (LNA) of the RF signal processing section (RF) described above with reference to FIG. 32. An output signal from the low noise amplifier (LNA) is multiplied by a local signal (RF-VCO) at a multiplier (DC) to be frequency-converted into an intermediate frequency signal. This intermediate frequency signal is supplied through a band-pass filter (BPF) to an intermediate frequency amplifier (IF-AMP) of an intermediate frequency processing section (IF-Stage). An output from the intermediate frequency amplifier (IF-AMP) is supplied through a quadrature demodulator (QDEM) to a base band signal processing section (BB-Stage) to be processed.

In the circuit of the radio terminal, the amplifier circuit of FIG. 32 is applied to the low noise amplifier to realize gain switching and to make input impedance constant. By the gain switching function, a dynamic range of the radio terminal is widened, and the input impedance of the low noise amplifier is not changed. Accordingly, an alignment can always be made with desired impedance such as 50Ω easily by using a single input alignment circuit. Moreover, low power consumption is required of the circuit used for the radio terminal. However, since the low noise amplifier, to which the present invention is applied, can be operated by a minimum necessary current, it leads to lower power consumption of the radio terminal.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. An oscillator comprising:
   a voltage control oscillation circuit having a first inductor; and
   a frequency control circuit having a second inductor electro-magnetically coupled to the first inductor, configured to supply a control current to the second inductor, and controls an oscillation frequency of the voltage control oscillation circuit by changing the control current to change an inductance value of the first inductor.

2. The oscillator according to claim 1, wherein the frequency control circuit includes a plurality of second inductors, and controls control currents flowing through the plurality of second inductors.

3. The oscillator according to claim 1, wherein the frequency control circuit changes at least one of an amplitude value and a phase of the current flowing through each of the second inductors.

4. The oscillator according to claim 1, wherein the frequency control circuit comprises a plurality of second inductors connected to the first inductor based on different coupling coefficients.

* * * * *